United States Patent
Kido et al.

(10) Patent No.: US 9,237,645 B2
(45) Date of Patent: Jan. 12, 2016

(54) FLEXIBLE PRINTED CIRCUIT INTEGRATED WITH CONDUCTIVE LAYER

(75) Inventors: Masayoshi Kido, Shiga (JP); Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 87 days.

(21) Appl. No.: 14/113,729

(22) PCT Filed: Apr. 26, 2012

(86) PCT No.: PCT/JP2012/061262
§ 371 (c)(1),
(2), (4) Date: Oct. 24, 2013

(87) PCT Pub. No.: WO2012/147870
PCT Pub. Date: Nov. 1, 2012

(65) Prior Publication Data
US 2014/0054081 A1 Feb. 27, 2014

(30) Foreign Application Priority Data
Apr. 28, 2011 (JP) ................... 2011-102112

(51) Int. Cl.
*H05K 9/00* (2006.01)
*H05K 1/02* (2006.01)
*H05K 1/03* (2006.01)

(52) U.S. Cl.
CPC ............ *H05K 1/0218* (2013.01); *H05K 1/02* (2013.01); *H05K 1/028* (2013.01); *H05K 1/0373* (2013.01); *H05K 9/003* (2013.01); *H05K 1/0393* (2013.01); *H05K 2201/0715* (2013.01)

(58) Field of Classification Search
CPC ................ H05K 9/0026; H05K 9/003; H05K 2201/0715
See application file for complete search history.

(56) References Cited

U.S. PATENT DOCUMENTS

| | | | |
|---|---|---|---|
| 2001/0033478 | A1 | 10/2001 | Ortiz et al. |
| 2001/0040043 | A1 | 11/2001 | Ortiz et al. |
| 2004/0187311 | A1 | 9/2004 | Ortiz et al. |
| 2006/0185884 | A1 | 8/2006 | Ortiz et al. |
| 2006/0243476 | A1 | 11/2006 | Ortiz et al. |
| 2009/0260872 | A1 * | 10/2009 | Chen ............................ 174/546 |

FOREIGN PATENT DOCUMENTS

| | | |
|---|---|---|
| CN | 1442033 | 9/2003 |
| JP | 52-12694 | 1/1977 |
| JP | 07-90028 | 4/1995 |

(Continued)

OTHER PUBLICATIONS

Search Report, International Application No. PCT/JP2012/061262, Jul. 10, 2012.

(Continued)

*Primary Examiner* — Hung V Ngo
(74) *Attorney, Agent, or Firm* — Kagan Binder, PLLC

(57) ABSTRACT

A conductive-layer-integrated flexible printed circuit board includes: (A) an electromagnetic-shielding conductive layer; (B) an insulator film; and (C) a wiring-pattern-equipped film the electromagnetic-shielding conductive layer (A), the insulator film (B), and the wiring-pattern-equipped film (C) being laminated in this order, the insulator film (B) containing at least (a) a binder polymer and (b) spherical organic beads.

5 Claims, 2 Drawing Sheets

(56) References Cited

FOREIGN PATENT DOCUMENTS

| | | |
|---|---|---|
| JP | 07-111371 | 4/1995 |
| JP | 10-77308 | 3/1998 |
| TW | 200803664 A | 1/2008 |
| WO | 87/04952 | 8/1987 |

OTHER PUBLICATIONS

English translation of International Preliminary Report on Patentability, International Application No. PCT/JP2012/061262, mailed Nov. 7, 2013.

* cited by examiner

FLEXIBLE PRINTED CIRCUIT INTEGRATED WITH CONDUCTIVE LAYER

This application claims benefit from International Application No. PCT/JP2012/061262, which was filed on Apr. 26, 2012, which in turn claims priority to Japanese Application No. 2011-102112, which was filed on Apr. 28, 2011, wherein the entireties of said patent applications are incorporated herein by reference.

TECHNICAL FIELD

The present invention relates to a conductive-layer-integrated flexible printed circuit board which is excellent in adhesion between an electromagnetic-shielding conductive layer and an insulator film, which is excellent in flexibility that can withstand repeated folding, in flame retardance, and in electrical insulation reliability, and which is small in warpage.

BACKGROUND ART

In recent years, as electronic devices such as mobile phones, video cameras, and laptop computers have rapidly become smaller and smaller in size and lighter and lighter in weight, flexible printed circuit boards (hereinafter referred to as "FPCs") have become indispensable. Meanwhile, as electronic circuits have become narrower in pitch and higher in frequency, it has become more and more important to take measures against electromagnetic noise that is generated from them. Accordingly, an approach has conventionally been made to cause an FPC to constitute an electromagnetic shielding material that blocks or absorbs electromagnetic noise that is generated from an electronic circuit. A known example of an electromagnetic-shielding FPC is an FPC having an insulating layer on top of which a shielding layer having an electrically-conducting adhesive layer, a metal thin-film layer, etc. is joined and that has a ground line to which the metal thin-film layer is electrically connected (e.g., see Patent Literature 1).

CITATION LIST

Patent Literature 1
Japanese Patent Application Publication, Tokukai, No. 2009-290103 A (Publication Date: Dec. 10, 2009)

SUMMARY OF INVENTION

Technical Problem

Patent Literature 1, which focuses attention on the electromagnetic shielding material, has as an object to maintain a long-term electromagnetic shielding effect even in the case of repeated bending and/or sliding. However, although the electromagnetic shielding material is an element that constitutes an electromagnetic-shielding-material-integrated FPC, the desired properties of the electromagnetic-shielding-material-integrated FPC cannot be satisfied simply by improving the properties of the electromagnetic shielding material. For example, the electromagnetic-shielding-material-integrated FPC will not exhibit satisfactory properties without an improvement in adhesion between the electromagnetic shielding material and the insulator film of the FPC.

Accordingly, with their attention focused on insulator films of FPCs, the inventors of the present invention diligently studied the adhesion of an insulator film to an electromagnetic shielding material, the flexibility, flame retardance, electrical insulation reliability, and warpage of electromagnetic-shielding-material-integrated FPCs.

Solution to Problem

As a result of their diligent study to attain the foregoing object, the inventors of the present invention found that a particular conductive-layer-integrated flexible printed circuit board (i.e., a conductive-layer-integrated flexible printed circuit board including: (A) an electromagnetic-shielding conductive layer; (B) an insulator film; and (C) a wiring-pattern-equipped film, the electromagnetic-shielding conductive layer (A), the insulator film (B), and the wiring-pattern-equipped film (C) being laminated in this order, the insulator film (B) containing at least (a) a binder polymer and (b) spherical organic beads) is excellent in adhesion between the electromagnetic-shielding conductive layer and the insulator film, is excellent in flexibility that can withstand repeated folding, in flame retardance, and in electrical insulation reliability, and is small in warpage, and, on the basis of these findings, attained the present invention. The present invention can attain the foregoing object with the following novel conductive-layer-integrated flexible printed circuit board.

That is, a conductive-layer-integrated flexible printed circuit board according to the present invention includes: (A) an electromagnetic-shielding conductive layer; (B) an insulator film; and (C) a wiring-pattern-equipped film, the electromagnetic-shielding conductive layer (A), the insulator film (B), and the wiring-pattern-equipped film (C) being laminated in this order, the insulator film (B) containing at least (a) a binder polymer and (b) spherical organic beads.

Further, the conductive-layer-integrated flexible printed circuit board according to the present invention is preferably configured such that the insulator film (B) contains (c) fine particles containing at least one type of element selected from the group consisting of phosphorus, aluminum, and magnesium.

Further, the conductive-layer-integrated flexible printed circuit board according to the present invention is preferably configured such that the electromagnetic-shielding conductive layer (A) contains (f) at least one type of element selected from the group consisting of silver, copper, aluminum, and nickel.

Further, the conductive-layer-integrated flexible printed circuit board according to the present invention is preferably configured such that the insulator film (B) is made from a resin composition containing (d) a thermosetting resin.

Further, the conductive-layer-integrated flexible printed circuit board according to the present invention is preferably configured such that the insulator film (B) is made from a photosensitive resin composition containing (e) a photopolymerization initiator.

Advantageous Effects of Invention

As described above, a conductive-layer-integrated flexible printed circuit board according to the present invention includes: (A) an electromagnetic-shielding conductive layer; (B) an insulator film; and (C) a wiring-pattern-equipped film, the electromagnetic-shielding conductive layer (A), the insulator film (B), and the wiring-pattern-equipped film (C) being laminated in this order, the insulator film (B) containing at least (a) a binder polymer and (b) spherical organic beads. This brings above an effect of being excellent in adhesion between an electromagnetic-shielding conductive layer and an insulator film, being excellent in flexibility that can withstand repeated folding, in flame retardance, and in electrical insulation reliability, and being small in warpage.

DESCRIPTION OF EMBODIMENTS

The present invention is described in detail below. All of those academic documents and patent documents mentioned herein are used as references herein. It should be noted that unless otherwise specified, the range of numerical values "A to B", the symbol "%", and the term "part(s)" denote "not less than A (equal to or greater than A) and not greater than B (equal to or less than B)", "%, by mass", and "part(s) by mass", respectively.

A conductive-layer-integrated flexible printed circuit board (conductive-layer-integrated FPC) according to the present invention needs only include: (A) an electromagnetic-shielding conductive layer; (B) an insulator film; and (C) a wiring-pattern-equipped film, the electromagnetic-shielding conductive layer (A), the insulator film (B), and the wiring-pattern-equipped film (C) being laminated in this order, the insulator film (B) containing at least (a) a binder polymer and (b) spherical organic beads.

It should be noted here that the findings that a conductive-layer-integrated FPC of the present invention is excellent in adhesion between the electromagnetic-shielding conductive layer and the insulator film, is excellent in flexibility that can withstand repeated folding, in flame retardance, and in electrical insulation reliability, and is small in warpage are believed to be due to the fact that the introduction of a spherical organic filler into the insulator film causes the insulator film to have asperities on a surface thereof, thereby increasing the amount of space on the insulator film that adheres to the electromagnetic-shielding conductive layer and improving the adhesion of the insulator film to the electromagnetic-shielding conductive layer. Unlike the anchoring effect of desorption of a filler, which is considered as a general technique for improving adhesion, the present invention improves adhesion without desorption of the spherical organic beads and therefore does not have a problem of contamination by a desorbed filler. Further, the use of the spherical organic filler can improve the adhesion due to an improvement in fracture toughness due to stress relaxation and, furthermore, impart flexibility, so that the resulting conductive-layer-integrated FPC is high in bend ability.

The following describes a conductive-layer-integrated FPC of the present invention, (A) an electromagnetic-shielding conductive layer, (B) an insulator film, and (C) a wiring-pattern-equipped film.

[Conductive-Layer-Integrated FPC]

Figure 1:
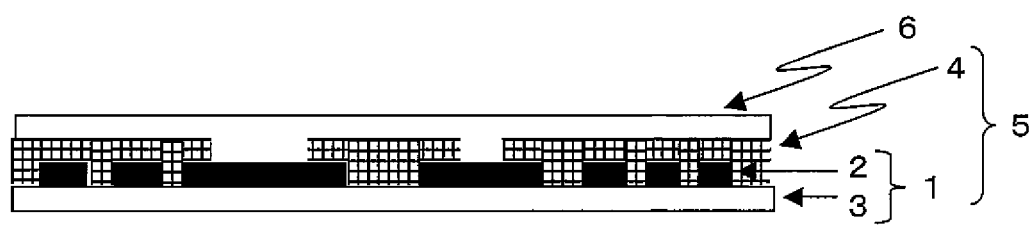
FIG. 1 is a diagram showing a configuration of a conductive-layer-integrated flexible printed circuit board (conductive-layer-integrated FPC).

FIG. 1 is a diagram showing a configuration of a conductive-layer-integrated FPC of the present invention, but this is not to imply any limitation. First, on (C) a wiring-pattern-equipped film (1) composed of a wiring pattern (2) and a base film (3), (B) an insulator film (4) is formed, so that an FPC (5) is obtained. Then, (A) an electromagnetic-shielding conductive layer (6) is formed on (B) the insulator film (4), whereby a conductive-layer-integrated FPC of the present invention can be obtained.

[(A) Electromagnetic-Shielding Conductive Layer]

The electromagnetic-shielding conductive layer (A) of the present invention is an electrically-conducting layer that exhibits an effect of blocking electromagnetic waves at or exceeding 10 dB. In general, the higher a conductive layer is in electric conductivity, the more it is effective in blocking electromagnetic waves. Therefore, it is preferable that the electromagnetic-shielding conductive layer (A) contain a metal that is high in electric conductivity, e.g., (f) at least one type of element selected from the group consisting of silver, copper, aluminum, and nickel.

Figure 2:
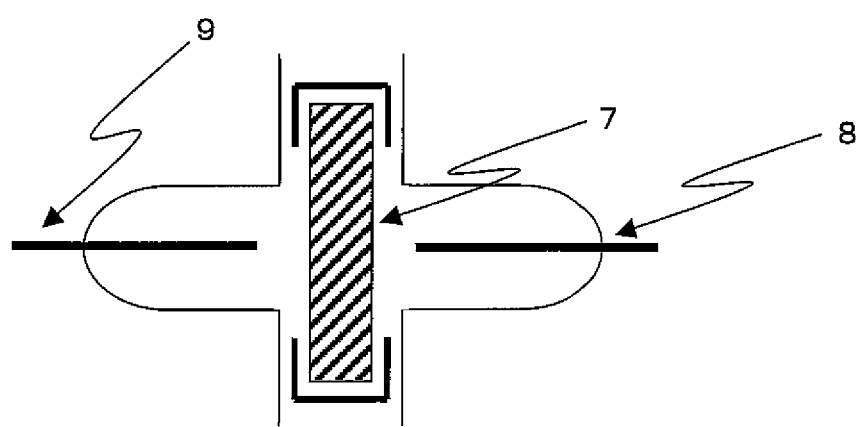
FIG. 2 is a diagram showing how electromagnetic shielding performance is evaluated according to the KEC method.

It should be noted here that an example of a method for evaluating the electromagnetic shielding effect of an electromagnetic-shielding conductive layer (A) according to the present invention is, but is not particularly limited to, the KEC method. FIG. 2 is a diagram showing how electromagnetic shielding performance is evaluated according to the KEC method. The KEC method is a method that is carried out by using a jig divided into a receiving antenna (8) and a transmitting antenna (9) between which a measurement sample (7) is placed so that attenuation of signals is evaluated at the receiving antenna. It should be noted here that the electromagnetic shielding effect can be calculated according to (formula 1):

$$SE \text{ (Shielding Effect)} = 20 \log 10 Eo/Ex \text{ [dB]} \qquad \text{(formula 1)},$$

where Eo denotes the field intensity of space in the absence of a shielding material and Ex denotes the field intensity of space in the presence of a shielding material.

Examples of the electromagnetic-shielding conductive layer (A) of the present invention encompass, but are not particularly limited to, (A-1) a film-type electromagnetic-shielding conductive layer, (A-2) a paste-type electromagnetic-shielding conductive layer, (A-3) a metal-thin-film-type electromagnetic-shielding conductive layer, etc. In particular, the film-type electromagnetic-shielding conductive layer is preferable because it can impart shielding properties without impairing the flexibility of the conductive-layer-integrated FPC.

(A-1) Film-Type Electromagnetic-Shielding Conductive Layer

Examples of the film-type electromagnetic-shielding conductive layer of the present invention are, but are not particularly limited to, a film obtained by dispersing conductive particles in a resin and a multi-layered film including multiple layers such as an electrically-conductive adhesive, a metal thin film, and an insulating layer. Examples of the film obtained by dispersing conductive particles in a resin encompass films manufactured under the trade names of TSS100-18 and TSS100-22 by Toyochem Co., Ltd., etc. Examples of the multi-layered film encompass films manufactured under the trade names of SF-PC5000, SF-PC5100, SF-PC5500, SF-PC5600, SF-PC5900, and SF-PC6000 by Tatsuta Electric Wire 86 Cable Co., Ltd., etc.

An example of a method for forming a film-type electromagnetic-shielding conductive layer on the insulator film according to the present invention is, but is not particularly limited to, a pressure and heat molding method that involves the use of a thermal press. Conditions for pressure and heat molding by a thermal press encompass, but are not particularly limited to, a thermal-press temperature of 100 to 180° C., a thermal-press pressure of 0.5 to 5.0 kgf/cm$^2$, and a thermal-press time of 10 to 90 minutes. Heat and pressure molding under these conditions makes it possible to form the electromagnetic-shielding conductive layer on the insulator film. For expression of the adhesion of the electromagnetic-shielding conductive layer to the insulator film, it is preferable to control the conditions for pressure and heat molding within the aforementioned ranges.

(A-2) Paste-Type Electromagnetic-Shielding Conductive Layer

Examples of the paste-type electromagnetic-shielding conductive layer of the present invention are, but are not particularly limited to, a film obtained by dispersing silver particles in a resin and a film obtained by dispersing nickel particles in a resin. Examples of film obtained by dispersing silver particles encompass a film manufactured under the trade name of RA FS039 by Toyochem Co., Ltd., a film manufactured under the trade name of XA-9015 by Fujikura Kasei Co., Ltd., etc. Examples of film obtained by dispersing nickel particles encompass a film manufactured under the trade name of FN-101 by Fujikura Kasei Co., Ltd., a film manufactured under the trade name of K-3435G by Pelnox Limited, etc.

An example of a method for forming a paste-type electromagnetic-shielding conductive layer on the insulator film according to the present invention is, but is not particularly limited to, a conventionally publicly-known printing method such as flexographic printing, gravure printing, screen printing, or rotary screen printing. The electromagnetic-shielding conductive layer can be formed on the insulator film by forming a coating film on the insulator film through the printing method and then heating the coating film at a heating temperature of 25° C. to 150° C. for a heating time of 10 minutes to 180 minutes in an oven with internal air circulation. For expression of electric conductivity and the adhesion of the electromagnetic-shielding conductive layer to the insulator film, it is preferable to control the printing and heating conditions within the aforementioned ranges.

(A-3) Metal-Thin-Film-Type Electromagnetic-Shielding Conductive Layer

The metal-thin-film-type electromagnetic-shielding conductive layer of the present invention is a conductive film that is obtained by forming a metal thin film directly on the insulator film. Examples of a method for forming a metal-thin-film-type electromagnetic-shielding conductive layer on the insulator film according to the present invention encompass, but are not particularly limited to, physical vapor deposition (PVD) such as vacuum vapor deposition, sputtering, and ion plating; chemical vapor deposition (CVD); and (iii) liquid phase deposition such as non-electrolytic plating. In particular, vacuum vapor deposition is desirable in view of mass productivity, and is preferable because it makes it possible to produce metal thin films stably and inexpensively. The term "vacuum vapor deposition" here means a method for forming a metal thin film on a surface of a targeted base material by vaporizing or sublimating a metal through heating under a vacuum condition. Examples of the metal to be deposited encompass, but are not particularly limited to, silver, copper, aluminum, gold, etc.

[(B) Insulator Film]

The insulator film (B) of the present invention is an insulating film having a thickness of 5 to 100 μm.

The thickness of the insulator film of the present invention can be measured by any method, e.g., by a method in conformity to JIS K 5400 3.5. In order for the insulator film to be excellent in flexibility and in electrical insulation reliability, it is preferable to control the thickness within the aforementioned range. In a case where the thickness is 5 μm or less, the insulator film may be low in electrical insulation reliability, and in a case where the thickness is 100 μm or greater, the insulator film may be low in flexibility.

Further, the insulator film (B) of the present invention contains at least (a) a binder polymer and (b) spherical organic beads). As such, the insulator film (B) is excellent in adhesion to the electromagnetic-shielding conductive layer.

[(a) Binder Polymer]

The binder polymer (a) of the present invention is a polymer which is soluble in an organic solvent and which has a weight-average molecular weight of 1,000 or greater but 1,000,000 or less in terms of polyethylene glycol.

Examples of the organic solvent encompass, but are not particularly limited to, sulfoxide solvents such as dimethyl sulfoxide and diethyl sulfoxide; formamide solvents such as N,N-dimethyl formamide and N,N-diethyl formamide; acetamide solvents such as N,N-dimethylacetamide and N,N-diethylacetamide; pyrrolidone solvents such as N-methyl-2-pyrrolidone and N-vinyl-2-pyrrolidone; hexamethylphosphoramide; and γ-butyrolactone. Furthermore, when needed, these organic polar solvents may be used in combination with aromatic hydrocarbon such as xylene or toluene.

Further examples of the organic solvent encompass: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether.

Organic solvent solubility, which is an index of solubility in an organic solvent, can be measured as parts by weight of the component (a) that is dissolved in 100 parts by weight of the organic solvent. If 5 parts by weight or more of the component (a) is dissolved in 100 parts by weight of an organic solvent, it can be determined that the component (a) is soluble in the organic solvent. An example of a method for measuring organic solvent solubility is, but is not particularly limited to, a method including adding 5 parts by weight of the component (a) to 100 parts by weight of an organic solvent, stirring the resulting mixture for 1 hour at 40° C., cooling the mixture to room temperature, letting it stand for 24 hours or longer, and confirming that the resulting solution is a homogeneous solution free of any insoluble matter or precipitate.

The weight-average molecular weight of the component (a) of the present invention can be measured, for example, by the following method.

(Weight-Average Molecular Weight Measurement)
Apparatus used: Equivalent of HLC-8220GPC, manufactured by Tosoh Corporation
Column: Two TSK gel Super AWM-H (6.0 mm I.D.×15 cm), manufactured by Tosoh Corporation
Guard column: TSK guard column Super AW-H, manufactured by Tosoh Corporation
Eluant: 30 mM LiBr+20 mM $H_3PO_4$ in DMF
Flow rate: 0.6 mL/min
Column temperature: 40° C.
Detection condition: RI: polarity (+), Response (0.5 sec)
Sample concentration: Approximately 5 mg/mL
Standard preparation: PEG (polyethylene glycol)

In order for the insulator film (B) to be excellent in flexibility and in chemical resistance, it is preferable to control the weight-average molecular weight within the aforementioned range. In a case where the weight-average molecular weight is 1,000 or less, the insulator film (B) may be low in flexibility and in chemical resistance. In a case where the weight-average molecular weight is 1,000,000 or greater, a resin composition containing the components (a) and (b) may be high in viscosity.

Examples of the component (a) of the present invention encompass, but are not particularly limited to, a polyurethane resin, a poly(meth)acrylic resin, a polyvinyl resin, a polystyrene resin, a polyethylene resin, a polypropylene resin, a polyimide resin, a polyamide resin, a polyacetal resin, a polycarbonate resin, a polyester resin, a polyphenylene ether resin, a polyphenylene sulfide resin, a polyethersulfone resin, and a polyetheretherketone resin. These resins can be used alone, or two or more of them can be used in combination. Among them, the polyurethane resin, which is a resin containing a urethane bond within a molecule, and the poly(meth)acrylic resin are preferably used because they make it easy for the component (a) to penetrate into the component (b), thus bringing about firm adhesion at the interface between the component (a) and the component (b), improvements in flexibility and folding endurance of the insulator film (B) as obtained by curing the resin composition containing the components (a) and (b), and a reduction in warpage of the insulator film (B).

The "resin containing a urethane bond within a molecule" of the present invention is a polymer which is soluble in an organic solvent, which contains a repeating unit containing at least one urethane bond within a molecule, and which has a weight-average molecular weight of 1,000 or greater but 1,000,000 or less in terms of polyethylene glycol.

The "resin containing a urethane bond within a molecule" of the present invention can be obtained through any reaction. For example, through a reaction between a diol compound represented by general formula (1):

[Chem. 1]

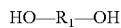

HO—$R_1$—OH        General formula (1)

(where $R_1$ denotes a divalent organic group) and a diisocyanate compound represented by general formula (2):

[Chem. 2]

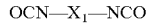

OCN—$X_1$—NCO        General formula (2)

(where $X_1$ denotes a divalent organic group), the resin containing a urethane bond within a molecule is obtained as a structure containing a repeating unit containing a urethane bond represented by general formula (3):

[Chem. 3]

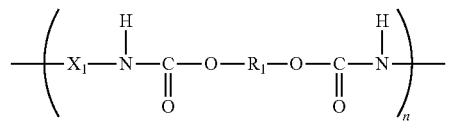

General formula (3)

(where $R_1$ and $X_1$ each independently represent a divalent organic group and n represents an integer of 1 or greater).

The diol compound of the present invention is not particularly limited, provided that it has the aforementioned structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by bringing a lactone such as γ-butyl lactone, ε-caprolactone, or δ-valerolactone into open-ring addition reaction; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. These compounds can be used alone, or two or more of them can be used in combination.

In particular, it is preferable to use a long-chain diol, such as polyethylene glycol, polypropylene glycol, polytetramethylene glycol, polyoxyalkylene diol, polyester diol, polycarbonate diol, or polycaprolactone diol, because the use of a long-chain diol brings about a reduction in modulus of elasticity of the insulator film (B) as obtained by curing the resin composition, an improvement in bendability, and a reduction in warpage.

The diisocyanate compound of the present invention is not particularly limited, provided that it has the aforementioned structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used alone, or two or more of them can be used in combination.

The "resin containing a urethane bond within a molecule" of the present invention can be synthesized by a method including combining a diol compound and a diisocyanate compound so that a ratio of the number of isocyanate groups to the number of hydroxyl groups is isocyanate groups/hydroxyl groups=0.5 or more but 2.0 or less and causing the diol compound and the isocyanate compound with each other in the absence of a solvent or in an organic solvent.

Further, in a case where two or more diol compounds are used, the two or more diol compounds may be brought into reaction with the diisocyanate compound after the two or more diol compounds have been mixed, or each of the two or more diol compounds may be each separately brought into reaction with the diisocyanate compound. Alternatively, it is possible to bring the diol compounds into reaction with the diisocyanate compound first, bring the resulting terminal isocyanate component into reaction with still another diol compound then, and further bring the reaction product into reaction with the diisocyanate compound. The same applies to a case where two or more diisocyanate compounds are used. This is how a desired resin containing a urethane bond within a molecule can be prepared.

The reaction between the diol compound(s) and the diisocyanate compound(s) takes place at a temperature of preferably 40 to 160° C. or more preferably 60 to 150° C. If the temperature is lower than 40° C., the reaction takes too much time. If the temperature is higher 160° C., a three-dimensional reaction takes place during the reaction, which makes it easy for gelatinization to take place. The duration of the reaction can be determined as appropriate according to the scale of a batch and the conditions to be set for the reaction. Further, when needed, the reaction may be carried out in the presence of a catalyst such as a tertiary amine, an alkaline metal, an alkaline earth metal, a metal such as tin, zinc, titanium, or cobalt, or a semi-metal compound.

The reaction can be carried out in the absence of a solvent. However, in order to control the reaction, it is preferable to carry out the reaction in an organic solvent system. The organic solvent that is used herein is not particularly limited, and it is possible, for example, to use any one of those organic solvents mentioned above.

It is desirable that the organic solvent that is used in the reaction be added so that a solute concentration by weight in a reaction solution, i.e., a concentration of the reaction solution is 5% by weight or greater but 90% by weight or less. The solute concentration by weight in the reaction solution is more preferably 10% by weight or greater but 80% by weight or less. In a case where the concentration of the reaction solution is lower than 5% by weight, it may be undesirably so hard for a polymerization reaction to take place that there is a decrease in reaction speed, and it may be undesirably impossible to prepare a desired structural substance.

It is preferable that the "resin containing a urethane bond within a molecule" of the present invention further contain at least one type of organic group selected from the group consisting of a (meth)acryloyl group, a carboxyl group; and an imide group. The term "(meth)acryloyl group" here means an acryloyl group and/or a methacryloyl group. In a case where the resin composition contains a (meth)acryloyl group and serves as a photosensitive resin composition, the photosensitive resin composition has improved photosensitivity. This makes it possible to cure the photosensitive resin composition in a short amount of time by irradiating it with ultraviolet rays. In a case where the resin composition contains a carboxyl group, the resin composition has improved solubility in a dilute alkaline aqueous solution serving as a developer. This makes it possible to form a fine pattern with quick development. In a case where the resin composition contains an imide group, there is an improvement in the heat resistance of the insulator film (B) as obtained by curing the resin composition and the electrical insulation reliability of the insulator film (B) under high-temperature and high-humidity conditions.

The resin containing (i) a urethane bond within a molecule and (ii) a (meth)acryloyl group can be obtained through any reaction, e.g., by reacting, with a diol compound and a diisocyanate compound, at least either a compound containing a hydroxyl group and at least one (meth)acryloyl group and represented by general formula (4):

[Chem. 4]

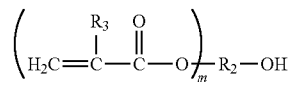

General formula (4)

(where $R_2$ represents a (m+1) valent organic group, $R_3$ represents hydrogen or an alkyl group, and m represents an integer of 1 to 3) or a compound containing an isocyanate group and at least one (meth)acryloyl group and represented by general formula (5):

[Chem. 5]

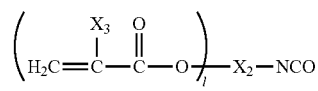

General formula (5)

(where $X_2$ represents a (l+1) valent organic group, $X_3$ represents hydrogen or an alkyl group, and l represents an integer of 1 to 3).

The "compound containing a hydroxyl group and at least one (meth)acryloyl group" of the present invention is not particularly limited, provided that it has the aforementioned structure. Examples of the compound encompass 2-hydroxyethyl(meth)acrylate, 2-hydroxypropyl(meth)acrylate, 2-hydroxybutyl(meth)acrylate, 2-hydroxy-3-phenoxypropyl(meth)acrylate, 2-hydroxy-1-acryloxy-3-methacryloxy propane, o-phenylphenolglycidyl ether(meth)acrylate, polyethylene glycol mono(meth)acrylate, pentaerythritol tri(meth)acrylate, tris(2-hydroxyethyl)isocyanurate di(meth)acrylate, 1,4-cyclohexanedimethanol mono(meth)acrylate, 4-hydroxyphenyl(meth)acrylate, 2-(4-hydroxyphenyl)ethyl(meth)acrylate, N-methylolacrylamide, 3,5-dimethyl-4-hydroxybenzyl acrylamide. These compounds can be used alone, or two or more of them can be used in combination.

The "compound containing an isocyanate group and at least one (meth)acryloyl group" of the present invention is not particularly limited, provided that it has the aforementioned structure. Examples of the compound encompass 2-(meth)acryloyloxyethyl isocyanate, 1,1-bis(acryloyloxymethyl)ethyl isocyanate, 2-(2-methacryloyloxyethyloxy)ethyl isocyanate. These compounds can be used alone, or two or more of them can be used in combination.

The resin containing (i) a urethane bond within a molecule and (ii) a carboxyl group can be obtained through any reaction, e.g., by reacting, with a diol compound and a diisocyanate compound, a compound containing two hydroxyl groups and one carboxyl group and represented by general formula (6):

[Chem. 6]

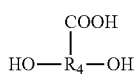

General formula (6)

(where R$_4$ represents a trivalent organic group).

The "compound having two hydroxyl groups and one carboxyl group" of the present invention is not particularly limited, provided that it has the aforementioned structure. Examples of the compound encompass 2,2-bis(hydroxymethyl)propionic acid, 2,2-bis(2-hydroxyethyl)propionic acid, 2,2-bis(3-hydroxymepropyl)propionic acid, 2,3-dihydroxy-2-methylpropionic acid, 2,2-bis(hydroxymethyl)butanoic acid, 2,2-bis(2-hydroxyethyl)butanoic acid, 2,2-bis(3-hydroxypropyl)butanoic acid, 2,3-dihydroxybutanoic acid, 2,4-dihydroxy-3,3-dimethylbutanoic acid, 2,3-dihydroxy hexadecanoic acid, 2,3-dihydroxy benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid. These compounds can be used alone, or two or more of them can be used in combination.

In particular, in order for the resin composition to be excellent in photosensitivity, it is preferable to use an aliphatic compound having two hydroxyl groups and one carboxyl group.

The "resin containing (i) a urethane bond within a molecule and (ii) an imide group can be obtained through any reaction, e.g., by reacting, with a diol compound and a diisocyanate compound, tetracarboxylic dianhydride represented by general formula (7):

[Chem. 7]

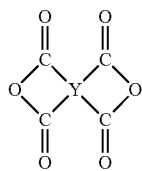

General formula (7)

(where Y represents a quadrivalent organic group).

Tetracarboxylic dianhydride of the present invention is not particularly limited, provided that it has the aforementioned structure. Examples of tetracarboxylic dianhydride encompass 3,3',4,4'-benzophenone tetracarboxylic dianhydride, pyromellitic dianhydride, 3,3',4,4'-oxydiphthalic dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic dianhydride, 3,3',4,4'-diphenyl sulfone tetracarboxylic dianhydride, 3,3',4,4'-biphenyltetracarboxylic dianhydride, 2,3,3',4-biphenyltetracarboxylic dianhydride, and 5-(2,5-dioxotetrahydro-3-furanyl)-3-methyl-3-cyclohexene-1,2-dicarboxylic anhydride. These types of tetracarboxylic dianhydride can be used alone, or two or more of them can be used in combination.

The poly(meth)acrylic resin of the present invention is a polymer which is soluble in an organic solvent, which has a repeating unit obtained through copolymerization of (meth)acrylic acid and/or an ester derivative of (meth)acrylic acid, and which has a weight-average molecular weight of 1,000 or greater but 1,000,000 or less in terms of polyethylene glycol.

The poly(meth)acrylic resin of the present invention can be obtained through any reaction, e.g., by causing (meth)acrylic acid and/or an ester derivative of (meth)acrylic acid to react in a solvent in the presence of a radical polymerization initiator.

Examples of the ester derivative of (meth)acrylic acid of the present invention encompass, but are not particularly limited to, methyl(meth)acrylate, ethyl(meth)acrylate, butyl(meth)acrylate, isobutyl(meth)acrylate, tertiary butyl(meth)acrylate, hexyl(meth)acrylate, 2-ethylhexyl(meth)acrylate, octyl(meth)acrylate, nonyl(meth)acrylate, decyl(meth)acrylate, dodecyl(meth)acrylate, stearyl(meth)acrylate, benzyl (meth)acrylate, etc. These ester derivatives of (meth)acrylic acid can be used alone, or two or more of them can be used in combination. In particular, among these ester derivatives of (meth)acrylic acid, it is preferable to use methyl(meth)acrylate, ethyl(meth)acrylate, and butyl(meth)acrylate from the viewpoint of the flexibility and chemical resistance of the insulator film made from the resin composition.

Examples of the radical polymerization initiator encompass: azo compounds such as azobisisobutyronitrile, azobis(2-methylbutylonitrile), and 2,2-azobis-2,4-dimethylvaleronitrile; organic peroxides such as t-butylhydroperoxide, cumene hydroperoxide, benzoyl peroxide, dicumyl peroxide, and di-t-butylperoxide; persulfates such as potassium persulfate, sodium persulfate, and ammonium persulfate; hydrogen peroxide; etc. These radical polymerization initiators can be used alone, or two or more of them can be used in combination.

The radical polymerization initiator is used in an amount of preferably 0.001 to 5 parts by weight or more preferably 0.01 to 1 part by weight with respect to 100 parts by weight of the monomer used. In a case where the amount is smaller than 0.001 parts by weight, it is hard for the reaction to proceed. In a case where the amount is larger than 5 parts by weight, there may be a decrease in molecular weight of the poly(meth)acrylic resin.

It is preferable that the amount of a solvent that is used in the reaction be such that a solute concentration by weight in a reaction solution, i.e., a concentration of the reaction solution is 5% by weight or greater but 90% by weight or less. The solute concentration by weight in the reaction solution is more preferably 20% by weight or greater but 70% by weight or less. In a case where the concentration of the reaction solution is lower than 5% by weight, it may be so hard for a polymerization reaction to take place that there is a decrease in reaction speed, and it may be impossible to prepare a desired structural substance. In a case where the concentration of the reaction solution is higher than 90% by weight, the reaction solution is so high in viscosity that the reaction may not be uniform.

The reaction takes place at a temperature of preferably 20 to 120° C. or more preferably 50 to 100° C. In a case where the temperature is lower than 20° C., the reaction takes too much time. In a case where the temperature is higher 120° C., there may occur gelatinization due to a side reaction accompanied by three-dimensional crosslinking. The duration of the reaction can be determined as appropriate according to the scale of a batch and the conditions to be set for the reaction.

In order for the insulator film (B) to improve in heat resistance, it is preferable that the component (a) of the present invention be a polyimide resin. The polyimide resin is a polymer which contains a repeating unit containing at least one imide group within a molecule and which has a weight-average molecular weight of 1,000 or greater but 1,000,000 or less in terms of polyethylene glycol.

The polyimide resin of the present invention can be obtained through any reaction, e.g., by causing a diamino compound to react with tetracarboxylic dianhydride represented by general formula (7).

Examples of the diamino compound of the present invention encompass, but are not particularly limited to, diamino phenols such as m-phenylenediamine, o-phenylenediamine, p-phenylenediamine, m-aminobenzylamine, p-aminobenzylamine, bis(3-aminophenyl)sulfide, (3-aminophenyl)(4-aminophenyl) sulfide, bis(4-aminophenyl)sulfide, bis(3-aminophenyl)sulfoxide, (3-aminophenyl)(4-aminophenyl)sulfoxide, bis(4-aminophenyl)sulfoxide, bis(3-aminophenyl)sulfone, (3-aminophenyl)(4-aminophenyl)sulfone, bis(4-aminophenyl)sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis[4-(3-aminophenoxy)phenyl]sulfoxide, bis[4-(aminophenoxy)phenyl]sulfoxide, (4-aminophenoxyphenyl)(3-aminophenoxyphenyl)phenyl]sulfoxide, bis[4-(3-aminophenoxy)phenyl]sulfone, bis[4-(4-aminophenoxy)phenyl]sulfone, (4-aminophenoxyphenyl)(3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl]methane, bis[4-(4-aminophenoxy)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl)]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis[(hydroxyphenoxy)phenyl]sulfone compounds such as 2,2-bis[4-(4-amino-3-hydroxyphenoxy)phenyl]sulfone; and bis(hydroxyphenoxy)biphenyl compounds such as 4,4'-diamino-3,3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. These diamino compounds can be used alone, or two or more of them can be used in combination.

Such a reaction between tetracarboxylic dianhydride and a diamino compound can be carried out by any method, e.g., by any one of the following methods.

Method 1: A solution is prepared in advance by dispersing or dissolving tetracarboxylic dianhydride in an organic solvent, and then a diamino compound is added to the solution to react with tetracarboxylic dianhydride. Thus, a polyamide acid solution is prepared. At this time, the diamino compound is added so that a total amount of the diamino compound that is added is 0.50 mol to 1.50 mol with respect to 1 mol of tetracarboxylic dianhydride. After completion of the reaction between tetracarboxylic acid dianhydride and the diamino compound, the resulting polyamide acid solution is imidized by heating it at 100° C. or higher but 300° C. or lower or, more preferably, at 150° C. or higher but 250° C. or lower.

Method 2: A polyamide acid solution is prepared by the same method as Method 1. An imidization catalyst (preferably a tertiary amine such as pyridine, picoline, isoquinoline, trimethylamine, triethylamine, or tributhylamine)) and a dehydrating agent (such as acetic anhydride) are added to the polyamide acid solution, and the resulting polyimide acid solution is imidized by heating it to 60° C. or higher but 180° C. or lower.

Method 3: A polyamide acid solution is prepared by the same method as Method 1. The polyamide acid solution thus prepared is placed in a vacuum oven heated to a temperature of 100° C. or higher but 250° C. or lower, and is imidized by heating and drying it under vacuum.

[(b) Spherical Organic Beads]

The spherical organic beads (b) of the present invention are spherical beads of a polymer containing carbon, and encompass those which are elliptical.

The average particle diameter of the component (b) of the present invention can be measured, as a median size based on volume (which is a particle diameter with respect to 50% of a value of cumulative size distribution), by the following method, for example.

(Average Particle Diameter Measurement)
Apparatus: Equivalent of LA-950V2, manufactured by Horiba, Ltd.
Method of measurement: laser diffraction/scattering.

The component (b) of the present invention is not limited to any particular average particle diameter. In order for the insulator film (B) to be excellent in flexibility and in chemical resistance, it is preferable that the component (b) have an average particle diameter of 3 to 15 µm. In a case where the component (b) has an average particle diameter of smaller than 3 µm, the insulator film (B) may fail to effectively form asperities on a surface thereof and therefore fail to obtain satisfactory adhesion to the electromagnetic-shielding conductive layer (A). In a case where the component (b) has an average particle diameter of 15 µm or larger, the insulator film (B) may be low in folding endurance.

It is possible to employ any method as means to confirm that the component (b) is contained in the insulator film (B) of the present invention. An example of such a method is a method including embedding, in a thermosetting resin, a conductive-layer-integrated FPC including an insulator film, exposing a through-the-thickness cross-section of the insulator film by polishing the insulator film with an ion beam, and observing the cross-section of the insulator film with a scanning electron microscope.

(Exposure of a Cross-Section of the Insulator Film)

From a conductive-layer-integrated FPC, a piece measuring 5 mm×3 mm was cut out with a knife. On both surfaces of the piece of the conductive-layer-integrated FPC, a protective film layer and a cover glass layer were formed from an epoxy embedding resin and cover glass, respectively. After that, a through-the-thickness cross-section of the insulator film was subjected to cross-section polisher processing with an ion beam.

(Cross-Section Polisher Processing)
Apparatus used: Equivalent of SM-09020CP, manufactured by JEOL, Ltd.
Processing condition: 6 kV (Cross-Section Observation of the Insulator Film)

The through-the-thickness cross-section of the insulator film thus obtained was observed with a scanning electron microscope.

(Scanning Electron Microscope Observation)
Apparatus used: Equivalent of S-3000, manufactured by Hitachi High-Technologies Corporation
Observation condition: Accelerating voltage 15 kV
Detector: Reflection electron detection (composition mode)
Magnification: ×1000.

In the reflection electron detection (composition mode) used herein, a difference in average atomic number between observed areas is strongly reflected in contrast, so that an area in which heavy elements are present is observed as a bright (white) area and an area in which light elements are present is observed as a dark (black) area. Therefore, the component (b), which is a spherical organic substance composed of comparatively light elements such as carbon, hydrogen, oxygen, and nitrogen, is observed as a dark (black) circular area.

Examples of the component (b) encompass, but are not particularly limited to, methyl polymethacrylate spherical organic beads such as those manufactured under the product names of Ganz Pearls GM-0600 and GM-0600W by Ganz Chemical Co., Ltd.; crosslinked methyl polymethacrylate spherical organic beads such as those manufactured under the product names of Ganz Pearls GM-0801S, GM-0807S, GM-1001-S, GM-1007S, GM-1505S-S, GMX-0610, GMX-0810, GMP-0800, GMDM-050M, GMDM-080M, GMDM-100M, and GMDM-150M by Ganz Chemical Co., Ltd. and those manufactured under the product names of Techpolymers MBX-5, MBX-8, and MBX-12 by Sekisui Plastics Co., Ltd.; crosslinked butyl polymethacrylate spherical organic beads such as those manufactured under the product names of Ganz Pearls GB-05S, GB-08S, GB-10S, and GB-15S by Ganz Chemical Co., Ltd. and those manufactured under the product names of Techpolymers BM30X-5 and BM30X-8 by Sekisui Plastics Co., Ltd.; crosslinked acrylic spherical organic beads such as those manufactured under the product names of Ganz Pearl GMP-0820 by Ganz Chemical Co., Ltd.; acrylic copolymer spherical organic beads such as those manufactured under the product names of Ganz Pearl GBM-55COS by Ganz Chemical Co., Ltd.; crosslinked styrene spherical organic beads such as those manufactured under the product names of Ganz Pearl GS-0605 and GS-1105 by Ganz Chemical Co., Ltd. and those manufactured under the product names of Techpolymers SBX-6 and SBX-8 by Sekisui Plastics Co., Ltd.; crosslinked ester polyacrylate spherical organic beads such as those manufactured under the product names of Techpolymers ABX-8, AF10X-8, AFX-15, and ARX-15 by Sekisui Plastics Co., Ltd.; nylon spherical organic beads such as those manufactured under the product names of Ganz Pearl GPA-550 by Ganz Chemical Co., Ltd.; silicone spherical organic beads such as those manufactured under the product names of Ganz Pearls SI-020, SI-030, and SI-045 by Ganz Chemical Co., Ltd.; crosslinked silicone spherical organic beads such as those manufactured under the product names of Ganz Pearl SIG-070 by Ganz Chemical Co., Ltd.; crosslinked urethane spherical organic beads such as those manufactured under the product names of Dynamic Beads UCN-8070CM Clear, UCN-8150CM Clear, UCN-5070D Clear, and UCN-5150D Clear by Dainichiseika Colour 86 Chemicals Mfg. Co., Ltd. and those manufactured under the product names of Art Pearls C-100 Clear, C-200 Clear, C-300 Clear, C-300WA, C-400 Clear, C-400WA, C-600 Clear, C-800 Clear, C-800WA, P-400T, P-800T, U-600T, CF-600T, JB-400T, JB-800T, CE-400T, and CE-800T by Negami Chemical Industrial Co., Ltd; etc. These types of spherical organic beads can be used alone, or two or more of them can be used in combination.

For a reduction in warpage of the insulator film (B), an improvement in flexibility that can withstand repeated folding, and an improvement in adhesion to the component (a), it is preferable that the component (b) of the present invention be crosslinked spherical organic beads containing a urethane bond within a molecule, among other types of spherical organic beads.

Blending the component (b) of the present invention with 100 parts by weight of the component (a) in an amount of preferably 30 to 100 parts by weight or more preferably 40 to 80 parts by weight allows the resulting insulator film to effectively form asperities on a surface thereof and to be excellent in adhesion to the electromagnetic-shielding conductive layer (A). This also allows the component (b) to bring about a filling effect to achieve a reduction in warpage of the insulator film (B), thus bringing about a stress relaxation effect and an improvement in fracture toughness that lead to an improvement in flexibility that can withstand repeated folding. In a case where the amount of the component (b) is smaller than 30 parts by weight, the insulator film (B) may be inferior in adhesion to the electromagnetic-shielding conductive layer (A) and in flexibility that can withstand repeated folding. In a case where the amount of the component (b) is larger than 100 parts by weight, the insulator film (B) may deteriorate in flame retardance and the resin composition may deteriorate in coating properties during coating. This may cause the coating film to form bubbles during coating and/or to be poor in appearance due to lack of leveling.

[(c) Fine Particles Containing at Least One Type of Element Selected from the Group Consisting of Phosphorus, Aluminum, and Magnesium]

The "fine particles (c) containing at least one type of element selected from the group consisting of phosphorus, aluminum, and magnesium" of the present invention are fine particles each having, within its structure, at least one type of element selected from the group consisting of phosphorus, aluminum, and magnesium.

The average particle diameter of the component (c) of the present invention can be measured, for example, by the same method as that by which the average particle diameter of the component (b) can be measured.

The component (c) of the present invention is not limited to any particular average particle diameter. In order for the insulator film (B) to be excellent in flexibility and in flame retardance, it is preferable that the component (c) have an average particle diameter of 1 to 10 µm. In a case where the component (c) have an average particle diameter of smaller than 1 µm, the insulator film (B) may fail to effectively form asperities on a surface thereof and therefore be inferior in adhesion to the electromagnetic-shielding conductive layer (A). In a case where the component (c) has an average particle diameter of 10 µm or larger, there may be a decrease in folding endurance.

Inclusion of the component (c) in the insulator film (B) of the present invention can be confirmed by the same method as that by which the inclusion of the component (b) in the insulator film (B) can be measured. In particular, for clear distinction of the component (c) in the insulator film, as with the component (b), it is preferable to employ the method including embedding an insulator film in a resin, exposing a through-the-thickness cross-section of the insulator film by polishing the insulator film with an ion beam, and observing the cross-section thus obtained with a scanning electron microscope. In a case where the scanning electron microscope has its detector in the reflection electron detection (composition mode), as in the case of the component (b), an area containing elemental phosphorus, which is heavier than those elements contained in the component (b), is observed as a half-dark (gray) circular or polygonal area and an area containing elemental aluminum and magnesium is observed as a bright (white) circular or polygonal area.

Further, since information on those elements contained in the component (c) can be obtained by analyzing, with a scanning electron microscope-X-ray microanalyzer (SEM-EPMA), an area of the component (c) in the through-the-thickness cross-section of the insulator film (B), inclusion of elemental phosphor, aluminum, and magnesium can be confirmed.

(Scanning Electron Microscope-X-Ray Microanalyzer)

Apparatus used: Equivalent of EMAX-7000, manufactured by Horiba, Ltd.

Analysis conditions: Accelerating voltage 15 kV; elapsed time 900 seconds.

Examples of the component (c) of the present invention encompass, but are not particularly limited to, fine particles containing elemental phosphor such as fine particles of ammonium polyphosphate, fine particles of melamine phosphate, and fine particles of phosphinate. These types of fine particles can be used alone, or two or more of them can be used in combination.

In order for the insulator film (B) to be excellent in flame retardance and to be less in bleed out, it is preferable that the component (c) of the present invention be fine particles of phosphinate, among other types of fine particles containing elemental phosphor. This makes it possible to suppress contact fault and process contamination.

The phosphinate is a compound represented by general formula (8):

[Chem. 8]

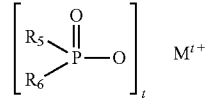

General formula (8)

(where $R_5$ and $R_6$ each independently represent a linear or branched $C_1$-$C_6$ alkyl or aryl group, M represents at least one type of metal selected from the group consisting of Mg, Ca, Al, Sb, Sn, Ge, Ti, Fe, Zr, Zn, Ce, Bi, Sr, Mn, Li, Na, and K, and t is an integer of 1 to 4).

The phosphinate is not particularly limited, provided that it has the aforementioned structure. Examples of the phosphinate encompass aluminum tris(diethyl phosphinate), aluminum tris(methylethyl phosphinate), aluminum tris(diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), and titanyl bis(diphenyl phosphinate). These phosphinates can be used alone, or two or more of them can be used in combination. In particular, for high flame retardance, it is preferable to use aluminum tris(diethyl phosphinate) and aluminum tris(methylethyl phosphinate), each of which contains elemental phosphor and aluminum.

Further, examples of fine particles containing elemental aluminum encompass fine particles of gibbsite-type aluminum hydroxide, fine particles of boehmite aluminum hydroxide, fine particles of aluminum tris(diethyl phosphinate), fine particles of aluminum tris(methylethyl phosphinate), and fine particles of aluminum tris(diphenyl phosphinate). These types of fine particles containing elemental aluminum can be used alone, or two or more of them can be used in combination.

Further, examples of fine particles containing elemental magnesium encompass fine particles of magnesium hydroxide and magnesium oxide. These types of fine particles containing elemental magnesium can be used alone, or two or more of them can be used in combination.

In order for the resulting insulator film to be excellent in flame retardance and in electrical insulation reliability, the amount of the component (c) of the present invention that is contained in 100 parts by weight of the component (a) is preferably 20 to 80 parts by weight or more preferably 25 to 75 parts by weight. In a case where the amount of the component (c) is smaller than 20 parts by weight, the insulator film (B) may be inferior in flame retardance. In a case where the amount of the component (c) is larger than 80 parts by weight, the resin composition may deteriorate in coating properties during coating. This may cause the coating film to form bubbles during coating and/or to be poor in appearance due to lack of leveling.

[(d) Thermosetting Resin]

The thermosetting resin (d) of the present invention is a compound which is an element that constitutes the resin composition from which the insulator film (B) is made, which forms a crosslinked structure when heated, and which functions as a thermosetting agent. In the present invention, it is preferable that the resin composition from which the insulator film (B) is made contain the thermosetting resin (d). Usable examples of the thermosetting resin (d) encompass: thermosetting resins such as an epoxy resin, a bismaleimide resin, a bisallylnadiimide resin, an acrylic resin, a methacrylic resin, a hydrosilyl resin, an allyl cured resin, and an unsaturated polyester resin; a side-chain reactive-group type thermosetting polymer having a reactive group such as an allyl group, a vinyl group, an alkoxysilyl group, or a hydrosilyl group in a side chain or terminal of a polymer chain; etc. These thermosetting resins can be used alone, or two or more of them can be used in combination. Among these thermosetting components, it is preferable to use an epoxy resin as the component (d). In order for the resulting insulating film to have heat resistance, adhesion to the wiring-pattern-equipped film, and adhesion to the electromagnetic-shielding conductive material, it is preferable to contain an epoxy resin component. An epoxy resin is a compound containing at least one epoxy group within a molecule. Examples of epoxy resins encompass: bisphenol A epoxy resins such as those manufactured under the trade names of jER828, jER1001, and jER1002 by Japan Epoxy Resins Co., Ltd., those manufactured under the trade names of ADEKA RESIN EP-4100E and ADEKA RESIN EP-4300E by Adeka Corporation, those manufactured under the trade names of RE-310S and RE-410S by Nippon Kayaku Co., Ltd., those manufactured under the trade names of EPICLON 840S, EPICLON 850S, EPICLON 1050, and EPICLON 7050 by DIC Corporation, and those manufactured under the trade names of Epotote YD-115, Epotote YD-127, and Epotote YD-128 by Tohto Kasei Co., Ltd; bisphenol F epoxy resins such as those manufactured under the trade names of jER806 and jER807 by Japan Epoxy Resins Co., Ltd., those manufactured under the trade names of ADEKA RESIN EP-4901E and ADEKA RESIN EP-4930, and ADEKA RESIN EP-4950 by Adeka Corporation, those manufactured under the trade names of RE-3035, RE-3045, RE-4035, and RE-4045 by Nippon Kayaku Co., Ltd., those manufactured under the trade names of EPICLON 830 and EPICLON 835 by DIC Corporation, those manufactured under the trade names of Epotote YDF-170, Epotote YDF-175S, and Epotote YDF-2001 by Tohto Kasei Co., Ltd; bisphenol S epoxy resins such as that manufactured under the trade name of EPICLON EXA-1514 by DIC Corporation; hydrogenated bisphenol A epoxy resins such as those manufactured under the trade names of jERYX8000, jERYX8034, and jERYL7170 by Japan Epoxy Resins Co., Ltd., that manufactured under the trade name of ADEKA RESIN EP-4080E by Adeka Corporation, that manufactured under the trade name of EPICLON EXA-7015 DIC Corporation, those manufactured under the trade names of Epotote YD-3000 and Epotote YD-4000D by Tohto Kasei Co., Ltd.; biphenyl epoxy resins such as those manufactured under the trade names of jERYX4000, jERYL6121H, jERYL6640, and jERYL6677 by Japan Epoxy Resins Co., Ltd. and those manufactured under the trade names of NC-3000 and NC-3000H by Nippon Kayaku Co., Ltd.; phenoxy epoxy resins such as those manufactured under the trade names of jER1256, jER4250, and jER4275 by Japan Epoxy Resins Co., Ltd.; naphthalene epoxy resins such as those manufactured under the trade names of EPICLON HP-4032, EPICLON HP-4700, and EPICLON HP-4200 by DIC Corporation, and that manufactured under the trade name of NC-7000L (trade name) by Nippon Kayaku Co., Ltd.; phenol novolac epoxy resins such as those manufactured under the trade names of jER152 and jER154 by Japan Epoxy Resins Co., Ltd., that manufactured under the trade name of EPPN-201-L by Nippon Kayaku Co., Ltd., those manufactured under the trade names of EPICLON N-740 and EPICLON N-770 by DIC Corporation, and that manufactured under the trade name of Epotote YDPN-638 by Tohto Kasei Co., Ltd.; cresol novolac epoxy resins such as those manufactured under the trade names of EOCN-1020, EOCN-102S, EOCN-103S, and EOCN-104S by Nippon Kayaku Co., Ltd. and those manufactured under the trade names of EPICLON N-660, EPICLON N-670, EPICLON N-680, and EPICLON N-695 by DIC Corporation; trisphenol methane epoxy resins such as those manufactured under the trade names of EPPN-501H, EPPN-501HY, and EPPN-502H Nippon Kayaku Co., Ltd.; dicyclopentadiene epoxy resins such as that manufactured under the trade name of XD-1000 by Nippon Kayaku Co., Ltd. and that manufactured under the trade name of EPICLON HP-7200 by DIC Corporation; amine epoxy resins such as those manufactured under the trade names of Epotote YH-434 and Epotote YH-434L by Tohto Kasei Co., Ltd.; flexible epoxy resins such as those manufactured under the trade names of jER871, jER872, jERYL7175, and jERYL7217 by Japan Epoxy Resins Co., Ltd. and that manufactured under the trade name of EPICLON EXA-4850 by DIC Corporation; urethane-modified epoxy resins such as those manufactured under the trade names of ADEKA RESIN EPU-6, ADEKA RESIN EPU-73, and ADEKA RESIN EPU-78-11 by Adeka Corporation; rubber-modified epoxy resins such as those manufactured under the trade names of ADEKA RESIN EPR-4023, ADEKA RESIN EPR-4026, and ADEKA RESIN EPR-1309 by Adeka Corporation; and chelate-modified epoxy resins such as ADEKA RESIN EP-49-10 and ADEKA RESIN EP-49-20 by Adeka Corporation.

In order for the insulator film (B) to improve in heat resistance, in chemical resistance, and in electrical insulation reliability, the amount of the component (d) of the present invention that is blended with 100 parts by weight of a total of the components (a), (b) and (c) is preferably 0.5 to 100 parts by weight, more preferably 1 to 50 parts by weight, or especially preferably 5 to 20 parts by weight.

In a case where the amount of the component (d) falls short of the aforementioned range, the insulator film (B) may be inferior in heat resistance and in electrical insulation reliability. In a case where the amount of the component (d) exceeds the aforementioned range, the insulator film (B) may be fragile and inferior in flexibility and may greatly warp.

[(e) Photopolymerization Initiator]

The photopolymerization initiator (e) of the present invention is a compound which an element that constitutes the resin composition from which the insulator film (B) is made and which initiates and accelerates a reaction of a radically-polymerizable-group-containing resin. Therefore, when the resin composition contains the photopolymerization initiator (e) of the present invention, the resin composition is a photosensitive resin composition. In the present invention, it is preferable that the resin composition from which the insulator film (B) is made contain the photopolymerization initiator (e). Examples of the component (e) of the present invention encompass Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazol e, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxy-cyclohexyl phenyl ketone, diacetylbenzyl, benzyl dimethyl ketal, benzyl diethyl ketal, 2(2'-furilethylidene)-4,6-bis (trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1-one, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanedione, 1-[4-(phenylthio)-,2-(O-benzoyloxime)], iodonium, (4-methylphenyl)[4-(2-methylpropyl)phenyl]-hexafluorophosphate(1-), ethyl-4-dimethylaminobenzoate, 2-ethylhexyl-4-dimethylaminobenzoate, ethanone, 1-[9-ethyl-6-(2-methylbenzoyl)-9H-carbazol-3-yl]-, 1-(O-acetyloxime), etc. It is desirable to select from among these photopolymerization initiators (e) as appropriate, and it is desirable to use one or more of them in combination.

In order for the resin composition to improve in photosensitivity, it is preferable that the amount of the photopolymerization initiator (e) of the present invention that is blended with 100 parts by weight of a total of the components (a), (b), (c), and (d) be 0.1 to 50 parts by weight. In a case where the amount of the component (e) falls short of the aforementioned range, the radically polymerizable group hardly reacts while the resin composition is being irradiated with light, with the result that the resin composition insufficiently cures. In a case where the amount of the component (e) exceeds the aforementioned range, it is difficult to adjust the amount of light with which the resin composition is irradiated, with the result that the resin composition is overexposed to light. Therefore, in order for the photo-curing reaction to proceed efficiently, it is preferable to adjust the amount of the component (e) within the aforementioned range.

[Other Components]

The resin composition from which the insulator film (B) of the present invention is made may further contain additives such as a radically polymerizable resin, a coloring agent, an adhesion-imparting agent, a polymerization inhibitor, and a solvent as needed.

A radically polymerizable resin of the present invention is not limited, provided that it is a resin that forms a chemical bond in response to the photopolymerization initiator (e). Furthermore, it is preferable that the radically polymerizable group be a (meth)acryloyl group or a vinyl group. Examples of radically polymerizable resins of the present invention encompass, but are not particularly limited to, bisphenol F EO-modified (n=2 to 50) diacrylate, bisphenol A EO-modified (n=2 to 50) diacrylate, bisphenol S EO-modified (n=2 to 50) diacrylate, bisphenol F EO-modified (n=2 to 50) dimethacrylate, bisphenol A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane; 2,2-bis[4-(methacryloxyethoxy)phenyl]propane, 2,2-bis[4-(methacryloxy diethoxy)phenyl]propane, 2,2-bis [4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl] propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri (ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, etc. In particular, it is preferable to use diacrylate or methacrylate having 2 to 50 or, more preferably, 2 to 40 of a repeating unit of EO (ethylene oxide) per molecule. Use of diacrylate or methacrylate having 2 to 50 of a repeating unit of EO (ethylene oxide) brings about an improvement in solubility of the photosensitive resin composition in an aqueous developer, such as an alkaline aqueous solution, and a reduction in developing time. Furthermore, stress hardly remains in the insulator film obtained by curing the photosensitive resin composition, so that when laminated on the wiring-pattern-equipped film (C), the insulator film inhibits the wiring-pattern-equipped film (C) from curling.

Concomitant use of the EO-modified diacrylate or dimethacrylate and acrylic resin having three or more acrylic groups or methacrylic groups is preferable in terms of enhancing developability. Suitably usable examples are acrylic resins such as ethoxylated isocyanuric acid EO-modified triacrylate, ethoxylated isocyanuric acid EO-modified trimethacrylate, ethoxylated trimethylolpropane triacrylate, trimethacrylate, ethoxylated trimethylolpropane triacrylate, trimethacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexaacrylate, 2,2,2-trisacryloyloxymethylethyl succinate, 2,2,2-trisacryloyloxymethylethyl phthalate, propoxylated ditrimethylolpropane tetraacrylate, propoxylated dipentaerythritol hexaacrylate, ethoxylated isocyanuric acid triacrylate, ε-caprolactone-modified tris-(2-acryloxy ethyl) isocyanurate, and caprolactone-modified ditrimethylolpropane tetraacrylate.

Further, suitably usable examples are those substances which have a hydroxyl group and/or a carbonyl group within a molecular structural skeleton such as 2-hydroxy-3-phenoxypropyl acrylate, monohydroxyethyl acrylate phthalate, ω-carboxy-polycaprolactone monoacrylate, an acrylic acid dimer, pentaerythritol tri- and tetraacrylate.

Other usable examples are radically polymerizable resins such as an epoxy-modified acrylic (methacylic) resin, a urethane-modified acrylic (methacylic) resin, and a polyester-modified acrylic (methacylic) resin.

When using a radically polymerizable resin, if any, it is preferable to use two or more of these radically polymerizable resins in combination so that the resulting photo-cured film have improved heat resistance, although these radically polymerizable resins may be used alone.

In order for the photosensitive resin composition to improve in photosensitivity, it is preferable that the amount of a radically polymerizable resin of the present invention that is blended with 100 parts by weight of a total of the components (a), (b), (c), (d), and (e) be 10 to 200 parts by weight.

In a case where the amount of a radically polymerizable resin falls short of the aforementioned range, the resulting insulator film may be low in alkali resistance and the photosensitive resin composition may have difficulty in gaining contrast when exposed and developed. In a case where the amount of a radically polymerizable exceeds the aforementioned range, there may be an increase in stickiness of a coating film obtained by applying the photosensitive resin composition onto the base material and drying the solvent, and the crosslink density may be so high that the resulting insulator film is fragile and breakable. In a case where the amount of a radically polymerizable resin falls within the aforementioned range, the resolution with which the photosensitive resin composition is exposed and developed can fall within an optimum range.

Examples of coloring agents of the present invention encompass a phthalocyanine compound, an azo compound, carbon black, titanium oxide, etc. Further, examples of adhesion-imparting agents encompass a silane coupling agent, a triazole compound, a tetrazole compound, a triazine compound, etc. Furthermore, examples of polymerization inhibitors encompass hydroquinone, hydroquinone monomethyl ether, etc. These additives can be used alone, or two or more of them can be used in combination.

A solvent of the present application is not particularly limited, provided that it is a solvent in which the component (a) and the component (d) can be dissolved. Examples of solvents encompass: sulfoxide solvents such as dimethyl sulfoxide and diethyl sulfoxide; symmetric glycol diethers such as methyl monoglyme (1,2-dimethoxyethane), methyl diglyme (bis(2-methoxyethyl)ether), methyl triglyme (1,2-bis (2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as γ-butyrolactone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy) ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. These solvents can be used alone, or two or more of them can be used in combination.

The amount of a solvent of the present invention that is blended with 100 parts by weight of a total of the components (a), (b), (c), (d), and (e) is preferably 10 to 400 parts by weight, more preferably 20 to 200 parts by weight, or especially preferably 40 to 100 parts by weight.

In order to adjust the viscosity or viscous property of the resin composition within a range appropriate for coating such as screen printing, it is preferable to adjust the amount of a solvent within the aforementioned range.

In a case where the amount of a solvent falls short of the aforementioned range, the resin composition is very high in viscosity. This may make coating so difficult that the coating film traps bubbles during coating and/or to is inferior in leveling. In a case where the amount of a solvent exceeds the aforementioned range, the resin composition is very low in viscosity. This may also make coating so difficult that the coating film is inferior in coatability of a circuit.

The insulator film (B) of the present invention can be obtained by uniformly mixing the components (a) through (e) and (an)other component(s) together, forming the resulting resin composition on the wiring-pattern-equipped film (C), forming minute openings through exposure and development as needed, and carrying out heat treatment. An example of how to uniformly mix the components (a) through (e) and (an)other component(s) together is, but is not to be particularly limited to, use of a commonly kneading apparatus such as a triple-roll mill or a beads-mill. In a case where the solvent is low in viscosity, it is possible to use a commonly stirring apparatus, instead. Among these apparatuses, it is preferable, in particular, to use a triple-roll mill for pulverization and dispersion, in order for the component (c) to be uniform in size. The particle diameter of each of the components in the resin composition after mixture can be measured by a method using a gauge as specified by JIS K 5600-2-5. Further, a particle size distribution measurement apparatus can be used to measure an average particle diameter, a particle diameter, and a particle-size distribution.

The insulator film can be formed from the resin composition by any method. Examples of the method encompass: (1) a method including applying the resin composition as it is onto the wiring-pattern-equipped film (C), and curing the resin composition; and (2) a method including forming the resin composition into a film on a support, attaching the film, which is uncured, onto the wiring-pattern-equipped film (C), and curing the film. Specifically, the method (1) can be carried out as follows: First, the resin composition is applied onto the wiring-pattern-equipped film (C), and the solvent is removed by drying the resin composition. The resin composition can be applied onto the wiring-pattern-equipped film (C) by screen printing, roller coating, curtain coating, spray coating, spin coating using a spinner, etc. The applied film (having a thickness of, preferably, 5 to 100 μm) is dried at 120° C. or lower or, preferably, 40 to 100° C.

Next, after the applied film is dried, a negative photomask is placed as needed on the applied film thus dried, and the applied film is exposed by irradiating it with rays of active light such as ultraviolet rays, visible rays, or electron rays. Then, the unexposed area is developed with a developer using any of various methods such as a shower method, a paddle method, a dipping method, an ultrasonic method, with the result that minute openings are formed. Since the amount of time required for the pattern to be exposed varies depending on (i) the atomizing pressure and flow rate of the development apparatus and (ii) the temperature of the etchant, it is desirable to find optimum conditions for the apparatus as appropriate.

It is preferable to use an alkaline aqueous solution as the developer. The developer may contain a water-soluble organic solvent such as methanol, ethanol, n-propanol, iso-propanol, or N-methyl-2-pyrrolidone. Examples of an alkaline compound from which the alkaline aqueous solution is prepared encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, etc. It is of course possible to use any other compound, provided that the aqueous solution exhibits basicity. The temperature of the developer depends on the composition of the photosensitive resin composition and the composition of the developer. In general, the temperature of the developer is preferably 0° C. or higher but 80° C. or lower or more preferably 10° C. or higher but 60° C. or lower.

The minute openings formed in the developing step are rinsed so that an unnecessary remaining portion of the developer is removed. Examples of a rinse agent that is used here encompass water, an acidic aqueous solution, etc.

Next, heat treatment is carried out. Carrying out heat treatment makes the resulting cured film (B) to be high in heat resistance and in chemical resistance. The thickness of the cured film (B) is determined in consideration of the thickness of the wiring-pattern-equipped film (C) etc., but is preferably approximately 2 to 50 μm. In order to prevent the oxidation of a conductor circuit or the like and not to cause a decrease in adhesion to the wiring-pattern-equipped film (C), the final heat treatment temperature is preferably 100° C. or higher but 250° C. or lower, more preferably 120° C. or higher but 200° C. or lower, or especially preferably 130° C. or higher but 180° C. or lower. A rise in heat treatment temperature accelerates the oxidation and deterioration of the conductor circuit or the like so that the cured film (B) may be low in adhesion to the wiring-pattern-equipped film (C).

Specifically, the method (2) is carried out as follows: First, after the resin composition is uniformly applied onto the support, heating and/or hot-air blowing is/are carried out, whereby a portion of the solvent is removed, with the result that the resin composition can form an uncured film.

The temperature at which the solvent is removed by carrying out heating and/or hot-air blowing needs only be such a temperature that the thermosetting resin or the like contained in the resin composition is not crosslinked by heat. Usable examples of the support used here encompass, but are not particularly limited to, various types of commercially-available film such as a polyethylene terephthalate (PET) film, a polyphenylene sulfide film, and a polyimide film. Among these supports, PET films are often used because they have a certain degree of heat resistance and are comparatively inexpensively available. The surface where the support and the resin composition are joined on top of each other may be surface-treated for improvements in adhesion and in removability. Further, a protective film may be laminated on the resin composition. Laminating the protective film on the resin composition prevents dirt and dust in the air from adhering, thus making it possible to prevent the resin composition from deteriorating in quality due to dryness. It is preferable that the protective film be laminated on a surface of the resin composition at a temperature of 10° C. to 50° C. When the laminating temperature is higher than 50° C., the protective film thermally expands so that the protective film may show wrinkles and curls after lamination. Since the protective film is removed from the resin composition before the resin composition is used, it is desirable that the surface where the support and the resin composition are joined on top each other have appropriate adhesion at the time of storage and be excellent in removability.

Examples of a material for the protective film encompass, but are not particularly limited to, a polyethylene film (PE film), a polyethylene vinyl alcohol film (EVA film), a "copolymer film of polyethylene and ethylene vinyl alcohol" (hereinafter abbreviated as "(PE+EVA) copolymer film"), a "laminate made by joining a PE film and a (PE+EVA) copolymer film" on top of each other, a "film made by co-extrusion of a (PE+EVA) copolymer film and polyethylene" (a film having a PE film as one surface thereof and a (PE+EVA) copolymer film as the other surface thereof), etc.

Next, the protective film is removed from the film including the protective film, the resin composition, and the support. Then, the wiring-pattern-equipped film is covered with the resin composition so that they face each other, and they are joined on top of each other by thermocompression bonding, which needs only be carried out according to, but is not to be particularly limited to, a thermal press process, a lamination process (thermal lamination process), a heat-roll lamination process, or the like. In the case of a thermal lamination process or a heat-roll lamination process (hereinafter described as "lamination process"), the processing temperature needs only be equal to or higher than a lower-limit temperature (hereinafter referred to as "bondable temperature") at or above which the lamination process can be carried out. Specifically, the bondable temperature falls within a range of preferably 50° C. to 150° C., more preferably 60° C. to 120° C., or especially preferably 80° C. to 120° C. If the processing temperature exceeds 150° C., a crosslinking reaction of the resin composition due to heating occurs during the lamination process so that curing of the resin composition may be accelerated. On the other hand, if the processing temperature is lower than 50° C., the resin composition is low in fluidity so that it is difficult to embed a pattern circuit in the resin composition.

The resin composition, turned into a film, is kept uncured. As such, the resin composition is at a moderate level of fluidity when it is subjected to a thermocompression boding process such as a thermal lamination process, and allows the conductor circuit of the wiring-pattern-equipped film to be suitably embedded in the resin composition.

As a result of the thermocompression bonding process, a laminate sample is obtained in which the resin composition is laminated on the wiring-pattern-equipped film and the support is further laminated on the resin composition. Next, a negative photomask is placed as needed on the support of the laminate sample, and the laminated sample is exposed by irradiating it with rays of active light such as ultraviolet rays, visible rays, or electron rays. Then, the support is removed, and the unexposed area is developed with a developer using any of various methods such as a shower method, a paddle method, a dipping method, an ultrasonic method, with the result that minute openings are formed. Since the amount of time required for the pattern to be exposed varies depending on (i) the atomizing pressure and flow rate of the development apparatus and (ii) the temperature of the etchant, it is desirable to find optimum conditions for the apparatus as appropriate.

It is preferable to use an alkaline aqueous solution as the developer. The developer may contain a water-soluble organic solvent such as methanol, ethanol, n-propanol, iso-propanol, or N-methyl-2-pyrrolidone. Examples of an alkaline compound from which the alkaline aqueous solution is prepared encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, etc. It is of course possible to use any other compound, provided that the aqueous solution exhibits basicity. The temperature of the developer depends on the composition of the photosensitive resin composition and the composition of the developer. In general, the temperature of the developer is preferably 0° C. or higher but 80° C. or lower or more preferably 10° C. or higher but 60° C. or lower.

The minute openings formed in the developing step are rinsed so that an unnecessary remaining portion of the developer is removed. Examples of a rinse agent that is used here encompass water, an acidic aqueous solution, etc.

Next, heat treatment is carried out. Carrying out heat treatment makes the resulting insulator film (B) to be high in heat resistance and in chemical resistance. The thickness of the insulator film (B) is determined in consideration of the thickness of the wiring-pattern-equipped film (C) etc., but is preferably approximately 2 to 50 μm. In order to prevent the oxidation of a conductor circuit or the like and not to cause a decrease in adhesion to the wiring-pattern-equipped film (C), the final heat treatment temperature is preferably 100° C. or higher but 250° C. or lower, more preferably 120° C. or higher but 200° C. or lower, or especially preferably 130° C. or higher but 180° C. or lower. A rise in heat treatment temperature accelerates the oxidation and deterioration of the conductor circuit or the like so that the insulator film (B) may be low in adhesion to the wiring-pattern-equipped film (C).

[(C) Wiring-Pattern-Equipped Film]

The wiring-pattern-equipped film of the present invention is a film including a base film having a thickness of 5 to 100 μm and a wiring pattern(s) on one or both surfaces of the base film. An example of a method for fabricating a wiring-pattern-equipped film according to the present invention is not particularly limited, but for example, the wiring-pattern-equipped film of the present invention can be fabricated by fabricating a flexible metal-clad laminate sheet through formation of a conductive layer on a base film and pattern-etching the conductive layer.

The base film of the present invention is not particularly limited, provided that it is a flexible and insulating film. Examples of the base film encompass polypropylene, crosslinked polyethylene, polyester, polybenzimidazole, polyimide, polyimideamide, polyetherimide, polyphenylene sulfide, a liquid crystal polymer, polyether ether ketone, etc. In a case where heat resistance is not required, it is preferable to use a polyester film, which is inexpensive. In a case where heat resistance is required, it is preferable to use a polyimide film.

Examples of the conductive layer of the present invention encompass, but are not particularly limited to, a copper or a copper alloy, stainless steel or an alloy thereof, nickel or a nickel alloy (inclusive of a 42 alloy), aluminum or an aluminum alloy, etc. Copper foil such as rolled copper foil and electrolytic copper foil, which are often used in common flexible metal-clad laminate sheets, can also be used in the present invention. It should be noted that these sheets of metal foil may have a surface coated with an antirust layer, a heat-resistant layer, or an adhesive layer.

Examples of a method for forming a conductive layer on a base film of the present invention, i.e., a method for fabricating a flexible metal-clad laminate sheet according to the present invention, encompass, but are not particularly limited to, a casting method, a laminating method, a metalizing method, etc. The casting method is a method including applying a base film in liquid form onto a conductive layer, drying the base film, and thermally curing the base film. The laminating method is a method including forming a base film and a conductive layer by thermocompression bonding. The laminating method is categorized into two types of laminating method: (1) a laminating method of fabricating a so-called three-layer metal-clad laminate sheet including a base film and a conductive layer with an adhesive sandwiched therebetween; (2) a laminating method of fabricating a so-called two-layer metal-clad laminate sheet including a base film and a conductive layer without an adhesive sandwiched therebetween. Examples of the adhesive include an epoxy resin, an acrylic resin, etc. Further, the metalizing method is a method including forming a metal thin film on a base film by vacuum vapor deposition or sputtering and forming a conductive layer by wet plating. Another type of metalizing method may include forming a conductive layer by wet plating without forming a metal thin film. It is possible to employ any of these methods to form a conductive layer(s) on one or both surfaces of a base film.

Examples of a method for pattern-etching a conductive layer according to present invention encompass, but are not particularly limited to, a photoresist technique etc. The photoresist technique is a method for forming a wiring pattern by forming a photoresist layer on a metal-clad laminate sheet, exposing the photoresist layer, developing the photoresist layer, etching a conductive layer, and removing a dry film. The photoresist layer can come in a positive or negative type, and can also come in liquid form, film form, or the like. An example of photoresist is, but is not particularly limited to, a method for forming a negative dry film resist on a metal-clad laminate sheet by thermal lamination or for forming a positive liquid resist on a metal-clad laminate sheet by coating and drying. In the case of a negative type, portions other than those exposed are removed by development, and in the case of a positive type, those portions exposed are removed. A dry film resist can easily form into a thick film. Examples of negative dry film resists encompass a resist manufactured under the trade name of SPG-152 by Asahi Kasei Co., Ltd., a resist manufactured under the trade name of RY-3215 Hitachi Chemical Co., Ltd., etc. A possible example of a method for removing a photoresist layer by development is to select and use a publicly-known chemical as appropriate for removing a photoresist layer, e.g., to remove a photoresist layer by development by spraying an aqueous solution of sodium carbonate (e.g., 0.2 to 1.5%). A possible example of conductive-layer etching is to select and use a publicly-known conductive-layer etchant as appropriate, e.g., to use an aqueous solution of potassium ferricyanide, an aqueous solution of ferric chloride, an aqueous solution of copper chloride, an aqueous solution of ammonium persulfate, an aqueous solution of sodium persulfate, a hydrogen peroxide solution, an aqueous solution of hydrofluoric acid, any combination thereof, etc.

A conductive-layer-integrated FPC of the present invention is excellent in adhesion between an electromagnetic-shielding conductive layer and an insulator film, excellent in flexibility that can withstand repeated folding, in flame retardance, and in electrical insulation reliability, and small in warpage. As such, it is especially suitable as an FPC for use in liquid crystal displays, sensors, and camera modules of small-sized mobile terminals. Furthermore, it can be used as an FPC for use in hinge bending, slide bending, cables, connectors, hard-disk optical pickup, etc.

The present invention is not limited to the description of the embodiments above, but may be altered by a skilled person within the scope of the claims. An embodiment based on a proper combination of technical means disclosed in different embodiments is encompassed in the technical scope of the present invention. All of those academic documents mentioned herein are used as references. The present invention is described in more detail below by way of Examples; however, the present invention is not to be limited solely to these Examples.

EXAMPLES

The present invention is described in concrete terms below by way of Examples; however, the present invention is not to be limited by these Examples.

[(a) Binder Polymer]

Synthesis Example 1

Into a reaction vessel equipped with a stirrer, a thermometer, a dropping funnel, and a nitrogen inlet tube, 100.0 g of methyl triglym (=1,2-bis(2-methoxyethoxy)ethane) were fed as a solvent for polymerization. The solvent was heated to 80° C. while being stirred with streams of nitrogen. Then, a mixture of 12.0 g (0.14 mol) of methacrylate, 28.0 g (0.16 mol) of benzyl methacrylate, 60.0 g (0.42 mol) of butyl methacrylate, and, as a radical polymerization initiator, 0.5 g of azobisisobutyronitrile, which had been prepared in advance at room temperature, was dropped through a dropping funnel for 3 hours while being kept at 80° C. After the completion of dropping, the reaction solution was heated to 90° C. while being stirred, and the reaction solution was further stirred for 2 hours while being kept at 90° C. Thus obtained was a poly(meth)acrylic resin solution (a-1) of the present invention. The poly(meth)acrylic resin solution thus obtained had a solid content concentration of 48%, a weight-average molecular weight of 48,000, and an acid value of 78 mgKOH/g. It should be noted that the solid content concentration, the weight-average molecular weight, and the acid value were measured in the following manners.

<Solid Content Concentration>

The solid content concentration of the poly(meth)acrylic resin solution (a) thus synthesized was measured in conformity to JIS K 5601-1-2. As a condition for drying, a condition of 150° C.×1 hour was selected.

<Weight-Average Molecular Weight>

The weight-average molecular weight of the poly(meth)acrylic resin solution (a) thus synthesized was measured under the following conditions:
Apparatus used: Equivalent of HLC-8220GPC, manufactured by Tosoh Corporation
Column: Two TSK gel Super AWM-H (6.0 mm I.D.×15 cm), manufactured by Tosoh Corporation
Guard column: TSK guard column Super AW-H, manufactured by Tosoh Corporation
Eluant: 30 mM LiBr+20 mM H3PO4 in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol).

<Acid Value>

The acid value of the poly(meth)acrylic resin solution (a) thus synthesized was measured in conformity to JIS K 5601-2-1.

Synthesis Example 2

Into a reaction vessel equipped with a stirrer, a thermometer, and a nitrogen inlet tube, 30.00 g of methyl triglym (=1,2-bis(2-methoxyethoxy)ethane) were fed as a solvent for polymerization. Then, 10.31 g (0.050 mol) of norbornene diisocyanate were further fed, and dissolved in the solvent by heating the resulting mixture to 80° C. while stirring it with streams of nitrogen. Added to the resulting solution over a period of 1 hour was a solution prepared by dissolving 50.00 g (0.025 mol) of polycarbonate diol (manufactured under the trade name of PCDL T5652 by Asahi Kasei Co., Ltd. with a weight-average molecular weight of 2000) and 3.70 g (0.025 mol) of 2,2-bis(hydroxymethyl) butanoate in 30.00 g of methyl triglym. The resulting solution was brought into reaction by stirring it under a heat of 80° C. for 5 hours. Obtained as a result of the reaction was a solution of resin having a urethane bond within a molecule (a-2). The resin solution thus obtained had a solid content concentration of 52%, a weight-average molecular weight of 5,600, and a solid content acid value of 22 mgKOH/g. It should be noted that the solid content concentration, the weight-average molecular weight, and the acid value were measured in the same manners as in Synthesis Example 1.

Synthesis Example 3

Into a reaction vessel equipped with a stirrer, a thermometer, and a nitrogen inlet tube, 130.60 g of methyl triglym (=1,2-bis(2-methoxyethoxy)ethane) were fed as a solvent for polymerization. Then, 31.2 g (0.100 mol) of 3,3',4,4'-oxydiphthalic dianhydride, 34.45 g (0.080 mol) of bis[4-(3-aminophenoxy)phenyl]sulfone, and 24.76 g (0.020 mol) poly(tetramethylene/3-methyltetramethylene ether)glycol bis(4-aminobenzoate) were further fed, and the resulting mixture was stirred for 30 minutes with streams of nitrogen to give a polyamide acid solution. Next, the solution was brought into reaction for 2 hours by heating it to 190° C. Obtained as a result of the reaction was a polyimide resin solution (a-3). The resin solution thus obtained had a solid content concentration of 49% and a weight-average molecular weight of 36,000. It should be noted that the solid content concentration and the weight-average molecular weight were measured in the same manners as in Synthesis Example 1.

Examples 1 to 4 and Comparative Examples 1 and 2

<Preparation of Resin Compositions>

Resin compositions were prepared by adding, to each of the binder polymers (a) obtained in Synthesis Examples, (b) spherical organic beads, (c) fine particles containing at least one type of element selected from the group consisting of phosphorus, aluminum, and magnesium, (d) a thermosetting resin, and an(other) component(s). Table 1 shows the amount of each ingredient that is contained in the resin solid content and the types of the ingredients. In Table 1, the amount of 1,2-bis(2-methoxyethoxy)ethane, which serves as a solvent, indicate a total amount including the amount of solvent that is contained each of the resin solutions synthesized in Synthesis Examples. The mixed solutions were completely defoamed by a defoaming device, and were evaluated as will be explained below.

TABLE 1

| Constituent Elements of the Resin Compositions | Ingredients | Ex. 1 | Ex. 2 | Ex. 3 | Ex. 4 | Comp. Ex. 1 | Comp. Ex 2 |
|---|---|---|---|---|---|---|---|
| Component (a) | a-1 | 60 | 60 | n/a | n/a | 60 | n/a |
| | a-2 | n/a | n/a | 60 | n/a | n/a | n/a |
| | a-3 | n/a | n/a | n/a | 60 | n/a | 60 |
| Component (b) | Ganz Pearl GM-0401S[1] | 30 | n/a | 30 | n/a | n/a | n/a |
| | Dynamic Beads UCN-8070CM Clear[2] | n/a | 30 | n/a | 30 | n/a | n/a |
| Component (c) | Exolit OP935[3] | 30 | 30 | 30 | n/a | 30 | n/a |
| Component (d) | JER630[4] | 15 | 15 | 15 | n/a | 15 | n/a |
| Other components | Aerosil R-974[5] | 1 | 1 | 1 | 1 | 1 | 1 |
| | 1,2-bis(2-methoxyethoxy)ethane | 90 | 90 | 90 | 90 | 90 | 90 |

[1] Product name of a crosslinked methyl polymethacrylate organic filler manufactured by Ganz Chemical Co., Ltd.; Average particle diameter: 4 μm
[2] Product name of a crosslinked urethane spherical organic filler manufactured by Dainichiseika Colour & Chemicals Mfg. Co., Ltd.; Average particle diameter: 7 μm
[3] Product name of fine particles containing elemental phosphor and aluminum (aluminum diethyl phosphinate) manufactured by Clariant Japan K.K.; Average particle diameter: 2.5 μm
[4] Product name of a multifunctional epoxy resin of a glycidyl amine type manufactured by DIC Corporation
[5] Product name of silica particles manufactured by Nippon Aerosil Co., Ltd.

<Fabrication of Evaluation Test Pieces of Conductive-Layer-Integrated FPC>

From each of the resin compositions thus prepared, an insulator film was fabricated as follows: First, the resin composition was flow-cast and applied onto an area of 100 mm×100 mm of a 75-μm-thick polyimide film (manufactured under the trade name of 75NPI by Kaneka Corporation) by using a Baker's applicator and dried at 80° C. for 20 minutes so that the final dried film had a thickness of 25 μm. Next, the resulting film was cured for 30 minutes in an oven at 150° C. to form an insulator film. Furthermore, on the insulator film made from the resin composition, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus fabricated were test pieces of conductive-layer-integrated FPC.

<Evaluation of Conductive-Layer-Integrated FPCs>

The conductive-layer-integrated FPCs thus obtained were evaluated for the following evaluation items. Table 2 shows results of the evaluation.

(i) Adhesion to a Conductive Layer

The adhesion of each of the test pieces obtained in section <Fabrication of Evaluation Test Pieces of Conductive-layer-integrated FPC> above was evaluated by a cross-cut adhesion test in conformity to JIS K5400.

Good (○): Showed no peels as a result of cross-cut adhesion testing

Fair (Δ): 95% or more of the squares remained

Poor (x): Only less than 80% of the squares remained (ii) Solder Dip Resistance

Each of the test pieces obtained in section <Fabrication of Evaluation Test Pieces of Conductive-layer-integrated FPC> above was floated on solder in a solder bath that had been completely melted at 260° C., in such a manner the conductive layer of the conductive-layer-integrated FPC faced and touched the solder. After 10 seconds, the test piece was withdrawn. This operation was carried out three times. The strength of adhesion between the conductive layer and the insulator film was evaluated by a cross-cut adhesion test in conformity to JIS K5400.

Good (○): Showed no peels as a result of cross-cut adhesion testing

Fair (Δ): 95% or more of the squares remained

Poor (x): Only less than 80% of the squares remained (iii) Bendability

In the same manner as in section <Fabrication of Evaluation Test Pieces of Conductive-layer-integrated FPC> above, an insulator-film-laminate film was fabricated from each of the resin compositions on a surface of a 25-μm-thick polyimide film (Apical 25NPI, manufactured by Kaneka Corporation). Furthermore, on the insulator film made from the resin composition, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus obtained were test pieces of conductive-layer-integrated FPC. Each of the test pieces thus obtained was cut into a strip measuring 30 mm×10 mm. The presence or absence of cracks was confirmed by folding the strip 10 times at 15 mm from an edge along a long side and visually checking the coating film.

Good (○): Found no cracks in the insulator film

Fair (Δ): Found a few cracks in the insulator film

Poor (x): Found cracks in the insulator film (iv) Warpage

Figure 3:
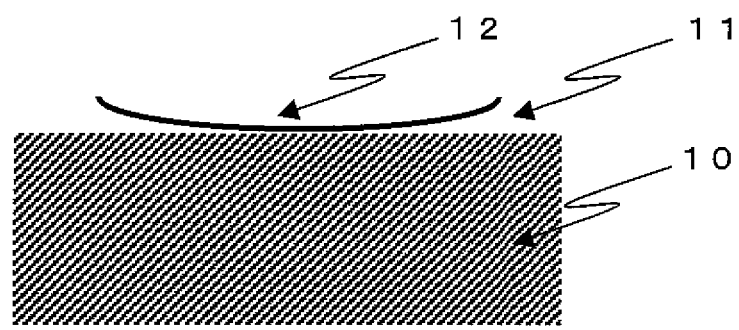
FIG. 3 is a diagram schematically showing how an amount of warpage of a film is measured.

Test pieces obtained in the same manner as in item "(iii) Bendability" above were cut into pieces each measuring 50 mm×50 mm. Each of the test pieces thus cut out was placed on a flat base so that the conductive layer faced down, and the height of warpage of an edge of the test piece was measured. FIG. 3 is a diagram schematically showing a measurement site. A smaller amount of warpage of the test piece indicates that the test piece would also have a smaller amount of warpage even if it were a conductive-layer-integrated FPC. A preferred amount of warpage is 5 mm or smaller.

(v) Flame Retardance

A flame retardance test was carried out in conformity to UL94, which is a standard for testing the flame retardance of plastic materials, as follows: In the same manner as in section <Fabrication of Evaluation Test Pieces of Conductive-layer-integrated FPC> above, a cured-film-laminate film was fabricated from each of the resin compositions on one surface of a 25-μm-thick polyimide film (Apical 25NPI, manufactured by Kaneka Corporation). Furthermore, on the insulator film made from the resin composition, a film-type conductive layer manufactured under the trade name of SF-PC5500 by Tatsuta Electric Wire & Cable Co., Ltd. was joined as an electromagnetic-shielding conductive layer by a thermal press at 150° C. and 2.5 MPa for 60 minutes. Thus obtained were test pieces of conductive-layer-integrated FPC. Each of the test pieces thus obtained was cut into samples each measuring 50 mm wide×200 mm long. Then, a marked line was drawn on each of the samples at 125 mm from one edge thereof along a long side. Each of the samples was rolled into a tubular shape having a diameter of approximately 13 mm. A PI tape was attached onto the sample so that there was no gap in an overlapped part of the sample above the marked line (i.e., at 75 mm from the other edge of the sample along a long side) or in an upper part of the sample. In this manner, twenty tubes were prepared for the flame retardance test. Ten of the tubes were treated under the condition (1) (23° C./50% RH/48 hours), the other ten tubes were treated under the condition (2) (at 70° C. for 168 hours) and then cooled for 4 hours or longer in a desiccator filled with anhydrous calcium chloride. Each of these samples were fixed upright with its upper part clamped. Then, a burner was turned on, brought close to a lower part of each of the samples, and held there for 10 seconds to ignite the sample. After 10 seconds, the burner was brought away from the sample, and the number of seconds it took for a flame or burning of each sample to be extinguished or to stop was measured.

Good (○): Under each of the conditions (1) and (2), those samples whose flames or burning ended up in automatic extinction within 5 seconds or at longest 10 seconds on average (of the ten samples) after the burner had been brought away from the samples Poor (x): There was at least one sample which was not extinguished within 10 seconds or which burned with a flame reaching the clamp in the upper part of the sample (vi) Electric Insulation Reliability Wiring-pattern-equipped films were prepared by fabricating a comb-shaped pattern (line width/space width=100 μm/100 μm) on a flexible metal-clad laminate sheet (whose electrolyte copper foil had a thickness of 12 μm and whose polyimide film was Apical 25NPI manufactured by Kaneka Corporation, with the copper foil joined with an epoxy adhesive). Next, the wiring-pattern-equipped films were dipped in 10% by volume of a sulfuric acid aqueous solution for 1 minute and washed with pure water, and the copper foil was surface-treated. After that, a 20-μm-thick insulator film was fabricated from each of the resin compositions on each of the wiring-pattern-equipped films in the same manner as in section <Fabrication of Evaluation Test Pieces of Conductive-layer-integrated FPC> above. Furthermore, on the insulator film made from the resin composition, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus obtained were test pieces of conductive-layer-integrated FPC. To both terminal areas of each of the test pieces thus obtained, a direct current of 20 V was applied in an environment tester set at 40° C. and 90% RH. With the direct current being applied, a change in insulation resistance, the occurrence of migration, etc. were observed.

Good (○): Showed a resistance of $10^8$ or higher 1000 hours after the start of testing, and showed no migration or dendrite.

Poor (x): Showed migration and dendrite 1000 hours after the start of testing.

TABLE 2

| Evaluation items | Ex. 1 | Ex. 2 | Ex. 3 | Ex. 4 | Comp. Ex. 1 | Comp. Ex. 2 |
|---|---|---|---|---|---|---|
| Adhesion to conductive layer | Good | Good | Good | Good | Poor | Poor |
| Solder dip resistance | Good | Good | Good | Good | Good | Good |
| Bendability | Good | Good | Good | Good | Poor | Poor |
| Warpage (mm) | 0.7 | 0.3 | 0.5 | 2.0 | 5.0 | 12.0 |
| Flame retardance | Good | Good | Good | Good | Good | Good |
| Electrical insulation reliability | Good | Good | Good | Good | Good | Good |

Examples 5 to 7 and Comparative Example 3

<Preparation of Photosensitive Resin Compositions>

Photosensitive resin compositions were prepared by adding, to each of the binder polymers (a) obtained in Synthesis Examples, (b) spherical organic beads, (c) fine particles containing at least one type of element selected from the group consisting of phosphorus, aluminum, and magnesium, (d) a thermosetting resin, (e) a photopolymerization initiator, and an(other) component(s). Table 3 shows the amount of each ingredient that is contained in the resin solid content and the types of the ingredients. In Table 3, the amount of 1,2-bis(2-methoxyethoxy)ethane, which serves as a solvent, indicate a total amount including the amount of solvent that is contained each of the resin solutions synthesized in Synthesis Examples. The mixed solutions were completely defoamed by a defoaming device, and were evaluated as will be explained below.

TABLE 3

| Constituent Elements of the Resin Compositions | Ingredients | Ex. 5 | Ex. 6 | Ex. 7 | Comp. Ex 3 |
|---|---|---|---|---|---|
| Component (a) | a-1 | 42 | 42 | n/a | 42 |
| | a-2 | n/a | n/a | 42 | n/a |
| | UXE-3000[6] | 18 | 18 | 18 | 18 |
| Component (b) | Ganz Pearl GM-0401S[1] | 30 | n/a | 30 | n/a |
| | Dynamic Beads UCN-8070CM Clear[2] | n/a | 30 | n/a | n/a |
| Component (c) | Exolit OP935[3] | 30 | 30 | 30 | 30 |
| Component (d) | JER630[4] | 15 | 15 | 15 | 15 |

TABLE 3-continued

| Constituent Elements of the Resin Compositions | Ingredients | Ex. 5 | Ex. 6 | Ex. 7 | Comp. Ex 3 |
|---|---|---|---|---|---|
| Component (e) | IRGACURE819[7] | 5 | 5 | 5 | 5 |
| Other components | A-9300[8] | 15 | 15 | 15 | 15 |
|  | Aerosil R-974[5] | 1 | 1 | 1 | 1 |
|  | 1,2-bis(2-methoxyethoxy)ethane | 90 | 90 | 90 | 90 |

[1] Product name of a crosslinked methyl polymethacrylate organic filler manufactured by Ganz Chemical Co., Ltd.; Average particle diameter: 4 μm
[2] Product name of a crosslinked urethane spherical organic filler manufactured by Dainichiseika Colour & Chemicals Mfg. Co., Ltd.; Average particle diameter: 7 μm
[3] Product name of fine particles containing elemental phosphor and aluminum (aluminum diethyl phosphinate) manufactured by Clariant Japan K. K.; Average particle diameter: 2.5 μm
[4] Product name of a multifunctional epoxy resin of a glycidyl amine type manufactured bu DIC Corporation
[5] Product name of silica particles manufactured by Nippon Aerosil Co., Ltd.
[6] Product name of a urethane-modified epoxy acrylate resin manufactured by Nippon Kayaku Co., Ltd.
[7] Product name of a photopolymerization initiator manufactured by BASF Japan Ltd.
[8] Product name NK Ester A-9300 (ethoxylated isocyanuric acid triacrylate), manufactured by Shin-Nakamura Chemical Co., Ltd.

<Fabrication of Evaluation Test Pieces of Conductive-Layer-Integrated FPC>

A layered product 1 was fabricated by forming, from each of the photosensitive resin compositions thus prepared, an insulator film as follows: First, the photosensitive resin composition was flow-cast and applied onto an area of 100 mm×100 mm of a 75-μm-thick polyimide film (manufactured under the trade name of 75NPI by Kaneka Corporation) by using a Baker's applicator and dried at 80° C. for 20 minutes so that the final dried film had a thickness of 25 μm. Next, exposure was carried out by ultraviolet irradiation with an integral exposure amount of 300 mJ/cm$^2$. Then, an aqueous solution of 1.0% by weight of sodium carbonate was heated to 30° C. and sprayed for 90 seconds at a discharge pressure of 1.0 kgf/mm$^2$. After development, the resulting film was sufficiently washed with pure water, and then cured for 30 minutes in an oven at 150° C. to form an insulator film. Furthermore, on the insulator film of the layered product 1 thus obtained, a film-type conductive layer manufactured under the trade name of SF-PC5500 by Tatsuta Electric Wire & Cable Co., Ltd. was joined as an electromagnetic-shielding conductive layer by a thermal press at 150° C. and 2.5 MPa for 60 minutes. Thus fabricated were test pieces of conductive-layer-integrated FPC.

<Evaluation of Conductive-Layer-Integrated FPCs>

The conductive-layer-integrated FPCs thus obtained were evaluated for the following evaluation items. Table 4 shows results of the evaluation.

(i) Adhesion to a Conductive Layer

The adhesion of each of the test pieces obtained in section <Fabrication of Evaluation Test Pieces of Conductive-layer-integrated FPC> above was evaluated by a cross-cut adhesion test in conformity to JIS K5400.
Good (○): Showed no peels as a result of cross-cut adhesion testing
Fair (Δ): 95% or more of the squares remained
Poor (x): Only less than 80% of the squares remained (ii) Solder Dip Resistance Each of the test pieces obtained in section <Fabrication of Evaluation Test Pieces of Conductive-layer-integrated FPC> above was floated on solder in a solder bath that had been completely melted at 260° C., in such a manner the conductive layer of the conductive-layer-integrated FPC faced and touched the solder. After 10 seconds, the test piece was withdrawn. This operation was carried out three times. The strength of adhesion between the conductive layer and the insulator film was evaluated by a cross-cut adhesion test in conformity to JIS K5400.
Good: Showed no peels as a result of cross-cut adhesion testing
Average: 95% or more of the squares remained
Poor: Only less than 80% of the squares remained (iii) Bendability In the same manner as in section <Fabrication of Evaluation Test Pieces of Conductive-layer-integrated FPC> above, a layered product 1 was fabricated by forming an insulator-film-laminate film from each of the photosensitive resin compositions on a surface of a 25-μm-thick polyimide film (Apical 25NPI, manufactured by Kaneka Corporation). Furthermore, on the insulator film of the layered product 1 thus obtained, a film-type conductive layer manufactured under the trade name of SF-PC5500 by Tatsuta Electric Wire & Cable Co., Ltd. was joined as an electromagnetic-shielding conductive layer by a thermal press at 150° C. and 2.5 MPa for 60 minutes. Thus obtained were test pieces of conductive-layer-integrated FPC. Each of the test pieces thus obtained was cut into a strip measuring 30 mm×10 mm. The presence or absence of cracks was confirmed by folding the strip 10 times at 15 mm from an edge along a long side and visually checking the coating film.
Good (○): Found no cracks in the insulator film
Fair (Δ): Found a few cracks in the insulator film
Poor (x): Found cracks in the insulator film (iv) Warpage Test pieces obtained in the same manner as in item "(iii) Bendability" above were cut into pieces each measuring 50 mm×50 mm. Each of the test pieces thus cut out was placed on a flat base so that the conductive layer faced down, and the height of warpage of an edge of the test piece was measured. FIG. 3 is a diagram schematically showing a measurement site. A smaller amount of warpage of the test piece indicates that the test piece would also have a smaller amount of warpage even if it were a conductive-layer-integrated FPC. A preferred amount of warpage is 5 mm or smaller.

(v) Flame Retardance

A flame retardance test was carried out in conformity to UL94, which is a standard for testing the flame retardance of plastic materials, as follows: In the same manner as in section <Fabrication of Evaluation Test Pieces of Conductive-layer-integrated FPC> above, a layered product 1 was fabricated by forming a cured film from each of the photosensitive resin compositions on one surface of a 25-μm-thick polyimide film (Apical 25NPI, manufactured by Kaneka Corporation). Furthermore, on the insulator film of the layered product 1 thus obtained, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus obtained were test pieces of conductive-layer-integrated FPC. Each of the test pieces thus obtained was cut into samples each measuring 50 mm wide×200 mm long. Then, a marked line was drawn on each of the samples at 125 mm from one edge thereof along a long side. Each of the samples was rolled into a tubular shape having a diameter of approximately 13 mm. A PI tape was attached onto the sample so that there was no gap in an overlapped part of the sample above the marked line (i.e., at 75 mm from the other edge of the sample along a long side) or in an upper part of the sample. In this manner, twenty tubes were prepared for the flame retardance test. Ten of the tubes were treated under the condition (1) (23° C./50% RH/48 hours), the other ten tubes were treated under the condition (2) (at 70° C. for 168 hours)

and then cooled for 4 hours or longer in a desiccator filled with anhydrous calcium chloride. Each of these samples were fixed upright with its upper part clamped. Then, a burner was turned on, brought close to a lower part of each of the samples, and held there for 10 seconds to ignite the sample. After 10 seconds, the burner was brought away from the sample, and the number of seconds it took for a flame or burning of each sample to be extinguished or to stop was measured.

Good (○): Under each of the conditions (1) and (2), those samples whose flames or burning ended up in automatic extinction within 5 seconds or at longest 10 seconds on average (of the ten samples) after the burner had been brought away from the samples Poor (x): There was at least one sample which was not extinguished within 10 seconds or which burned with a flame reaching the clamp in the upper part of the sample (vi) Electric Insulation Reliability Wiring-pattern-equipped films were prepared by fabricating a comb-shaped pattern (line width/space width=100 μm/100 μm) on a flexible metal-clad laminate sheet (whose electrolyte copper foil had a thickness of 12 μm and whose polyimide film was Apical 25NPI manufactured by Kaneka Corporation, with the copper foil joined with an epoxy adhesive). Next, the wiring-pattern-equipped films were dipped in 10% by volume of a sulfuric acid aqueous solution for 1 minute and washed with pure water, and the copper foil was surface-treated. After that, in the same manner as in section <Fabrication of Evaluation Test Pieces of Conductive-layer-integrated FPC> above, an FPC was fabricated by forming a 20-μm-thick insulator film from each of the resin compositions on a wiring patter on one surface of each of the wiring-pattern-equipped films. Furthermore, on the insulator film of the FPC thus obtained, a film-type conductive layer manufactured under the trade name of SF-PC5500 by Tatsuta Electric Wire 86 Cable Co., Ltd. was joined as an electromagnetic-shielding conductive layer by a thermal press at 150° C. and 2.5 MPa for 60 minutes. Thus obtained were test pieces of conductive-layer-integrated FPC. To both terminal areas of each of the test pieces thus obtained, a direct current of 20 V was applied in an environment tester set at 40° C. and 90% RH. With the direct current being applied, a change in insulation resistance, the occurrence of migration, etc. were observed.

Good (○): Showed a resistance of $10^8$ or higher 1000 hours after the start of testing, and showed no migration or dendrite.
Poor (x): Showed migration and dendrite 1000 hours after the start of testing.

TABLE 4

| Evaluation items | Ex. 5 | Ex. 6 | Ex. 7 | Comp. Ex. 3 |
|---|---|---|---|---|
| Adhesion to conductive layer | Good | Good | Good | Poor |
| Solder dip resistance | Good | Good | Good | Good |
| Bendability | Good | Good | Good | Poor |
| Warpage (mm) | 1.5 | 0.5 | 1.0 | 10.0 |
| Flame retardance | Good | Good | Good | Good |
| Electrical insulation reliability | Good | Good | Good | Good |

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable as measures against electromagnetic noise in electronic devices such as mobile phones, video cameras, and laptop computers.

REFERENCE SIGNS LIST

1 Wiring-pattern-equipped film
2 Wiring pattern
3 Base film
4 Insulator film
5 FPC
6 Electromagnetic-shielding conductive layer
7 Measurement sample
8 Receiving antenna
9 Transmitting antenna
10 Flat base
11 Amount of warpage
12 Insulator-film-laminated film

The invention claimed is:
1. A conductive-layer-integrated flexible printed circuit board comprising:
(A) an electromagnetic-shielding conductive layer;
(B) an insulator film; and
(C) a wiring-pattern-equipped film,
the electromagnetic-shielding conductive layer (A), the insulator film (B), and the wiring-pattern-equipped film (C) being laminated in this order,
the insulator film (B) containing at least (a) a binder polymer and (b) spherical organic beads.
2. The conductive-layer-integrated flexible printed circuit board as set forth in claim 1, wherein the insulator film (B) contains (c) fine particles containing at least one type of element selected from the group consisting of phosphorus, aluminum, and magnesium.
3. The conductive-layer-integrated flexible printed circuit board as set forth in claim 1, wherein the electromagnetic-shielding conductive layer (A) contains (f) at least one type of element selected from the group consisting of silver, copper, aluminum, and nickel.
4. The conductive-layer-integrated flexible printed circuit board as set forth in claim 1, wherein the insulator film (B) is made from a resin composition containing (d) a thermosetting resin.
5. The conductive-layer-integrated flexible printed circuit board as set forth in claim 1, wherein the insulator film (B) is made from a photosensitive resin composition containing (e) a photopolymerization initiator.

* * * * *